United States Patent
Erdim et al.

(10) Patent No.: US 9,892,215 B2
(45) Date of Patent: Feb. 13, 2018

(54) SYSTEM AND METHOD FOR DETERMINING FEEDRATES OF MACHINING TOOLS

(71) Applicant: Mitsubishi Electric Research Laboratories, Inc., Cambridge, MA (US)

(72) Inventors: Huseyin Erdim, Seattle, WA (US); Alan Sullivan, Middleton, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 570 days.

(21) Appl. No.: 14/033,617

(22) Filed: Sep. 23, 2013

(65) Prior Publication Data

US 2015/0088301 A1 Mar. 26, 2015

(51) Int. Cl.
- *G06F 17/50* (2006.01)
- *G05B 19/18* (2006.01)
- *G05B 19/4097* (2006.01)
- *G05B 19/416* (2006.01)

(52) U.S. Cl.
CPC ......... *G06F 17/5009* (2013.01); *G05B 19/18* (2013.01); *G05B 19/4097* (2013.01); *G05B 19/416* (2013.01); *G05B 2219/35148* (2013.01); *G05B 2219/49082* (2013.01)

(58) Field of Classification Search
None
See application file for complete search history.

(56) References Cited

U.S. PATENT DOCUMENTS

| | | | | |
|---|---|---|---|---|
| 4,833,617 A * | 5/1989 | Wang | ............... | G05B 19/4163 700/173 |
| 5,828,574 A * | 10/1998 | Robinson | ......... | G05B 19/40937 700/173 |
| 2002/0164221 A1* | 11/2002 | Izutsu | ............... | G05B 19/4166 409/132 |
| 2005/0246052 A1 | 11/2005 | Coleman et al. | | |
| 2010/0298961 A1* | 11/2010 | Frisken | ............... | G05B 19/4069 700/103 |
| 2011/0150592 A1* | 6/2011 | Diehl | ............... | G05B 19/40937 409/80 |
| 2012/0221140 A1 | 8/2012 | Bermanm et al. | | |

OTHER PUBLICATIONS

Sullivan et al. 'High accuracy NC milling using composite adaptively sampled distance fields', Computer-Aided Design, vol. 44, pp. 522-536 (2012).*

Wang et al. "Solid modeling for optimizing metal removal of three-dimensional NC end milling", Journal of Manufacturing Systems, 1988.

Lan et al. "The implementation of optimum MRR on digital PC-based lathe system", Int Journal Adv. Manufacturing Technology, 2007.

* cited by examiner

*Primary Examiner* — Mohammad Ali
*Assistant Examiner* — Bernard G Lindsay
(74) *Attorney, Agent, or Firm* — Gene Vinokur; James McAleenan; Hironori Tsukamoto

(57) ABSTRACT

A method determines a feedrate of a tool machining a workpiece according to a path. The method partitions the path into a set of segments, such that within each segment a function of engagement of the tool and the workpiece is substantially constant. Next, the method determines a feedrate for each segment in the set.

14 Claims, 22 Drawing Sheets

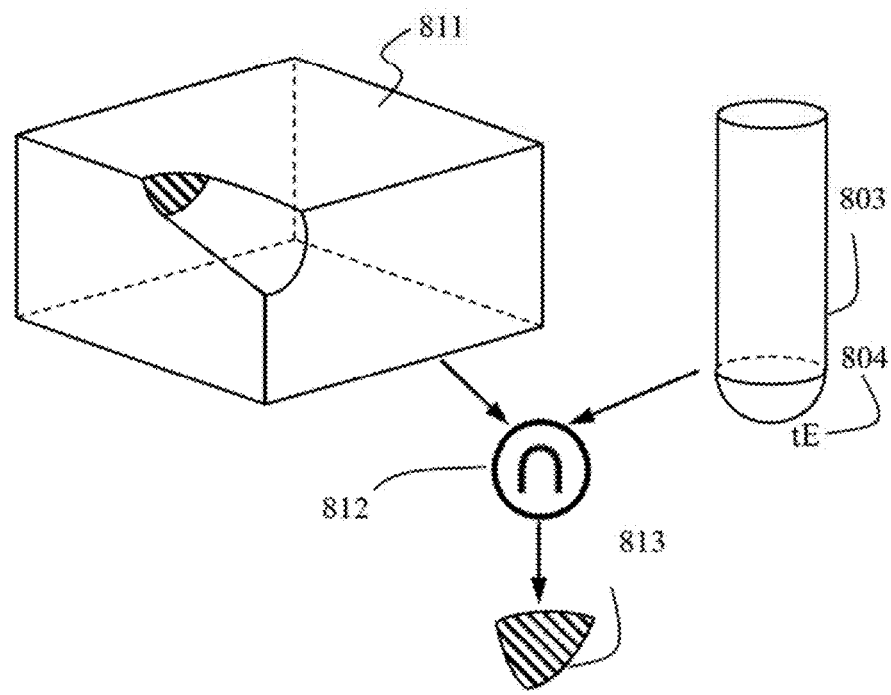
Fig. 8C
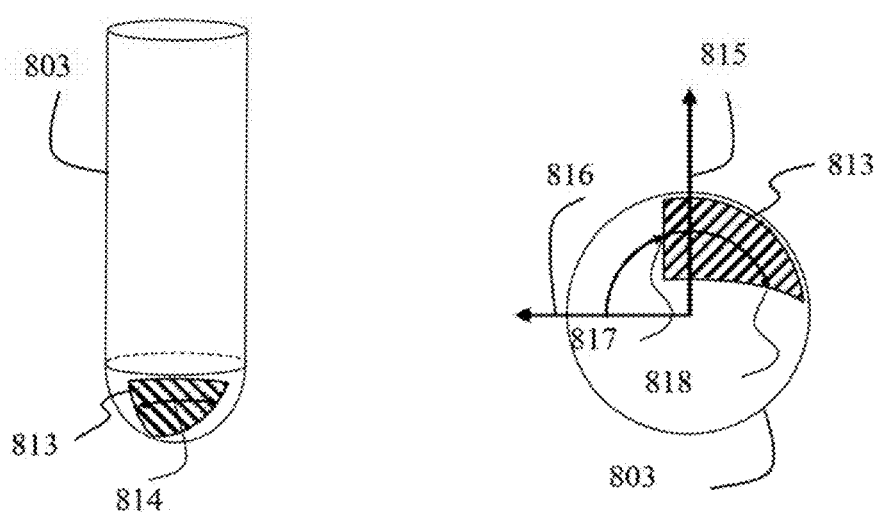
Fig. 8D
Fig. 8E

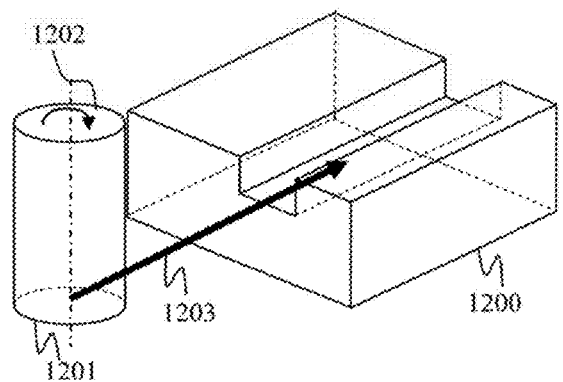
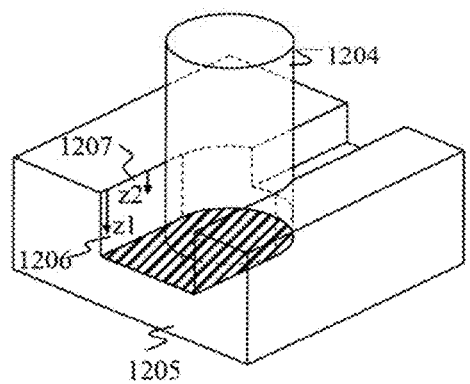
Fig. 12A          Fig. 12B
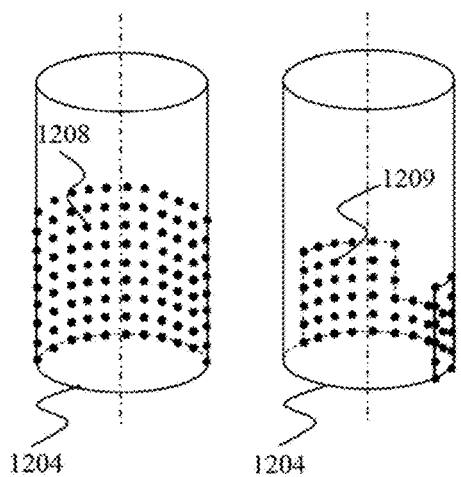
Fig. 12C

SYSTEM AND METHOD FOR DETERMINING FEEDRATES OF MACHINING TOOLS

FIELD OF THE INVENTION

The invention relates generally to simulation of a machining of a workpiece by a motion of a tool and more particularly to determining a feedrate of the tool.

BACKGROUND OF THE INVENTION

NC Milling

Simulating the process of numerically controlled (NC) milling is of fundamental importance in computer aided design (CAD) and computer aided manufacturing (CAM). During the simulation, a computer model of a workpiece is edited with a computer representation of an NC milling tool and a set of NC milling tool motions to simulate the milling process.

The workpiece model and tool representation can be visualized during the simulation to improve productivity, detect potential collisions between parts, such as the workpiece and the tool holder, and after the simulation to verify the final shape of the workpiece.

The final shape of the workpiece is affected by the selection of the tool, the tool motions and milling parameters. Instructions for controlling the motions are typically generated using the CAM system from a graphical representation of the desired final shape of the workpiece. The tool motions are typically implemented using numerical control programming language, also known as preparatory code or G-Codes, see, e.g., the RS274D and DIN 66025/ISO 6983 standards.

Swept Volumes

During milling, the tool moves relative to the workpiece according to a prescribed tool motion, referred to herein as a tool path. The tool path specifies the relative position, orientation, and other shape data of the tool with respect to the workpiece. In this disclosure, the milling is used as an example of the machining of the workpiece.

As the tool moves along the tool path, the tool carves out a "swept volume." During the milling, as the tool moves along the tool path, a portion of the workpiece that is intersected by the swept volume is removed. This material removal can be modeled computationally as a constructive solid geometry (CSG) difference operation, in which the portion of the workpiece is removed from the workpiece using a CSG subtraction operation of the swept volume from the workpiece.

Although NC machining simulation is used as an example application, swept volumes have applications in many areas of science, engineering, entertainment, and computer graphics. Some specific applications include computer-aided design, freeform design, computer-based drawing, animation, solid modeling, robotics, manufacturing automation, and visualization to name but a few.

The swept volumes of simple shapes moving along simple paths can sometimes be represented analytically, as described in U.S. Pat. No. 4,833,617. However, those methods do not generalize to complex shapes and complex tool paths. Swept volumes can be represented and approximated by several geometric forms, such as polygonal methods, Z-buffer, depth pixel (dexel) method and voxel based representations. It is concluded that research in this field is limited by the difficulty of implementing complex mathematical formulations of swept volumes using software, and that computing the boundaries of swept volumes remains a challenging problem requiring better visualization tools and more accurate methods.

Models of polygonal shapes can be encoded in a spatial hierarchy for efficient editing via CSG operations. The accuracy of each of those polygonal methods is limited by the polygonal representation of the object model, see for example U.S. Pat. Nos. 6,862,560 and 6,993,461. Millions of polygons may be required to accurately represent the curved surface of a complex tool, especially if the radius of curvature is small. Methods that use binary voxels to represent swept volumes are described in U.S. Pat. No. 6,044, 306 and "Octree-based Boundary Evaluation for General Sweeps", Proceedings, TMCE, 2008, Erdim and Ilies. The accuracy of those methods is limited by the size of the smallest voxel used to represent the swept volumes. Thus, those methods may either have limited accuracy or have prohibitive processing times and memory requirements for generating high precision models of swept volumes, or both. In addition, methods that approximate the swept volume as a series of discrete time steps have limited precision between the discrete time steps, and are subject to aliasing artifacts.

Distance Fields

Distance fields are an effective representation for rendering and editing shapes, as described in U.S. Pat. Nos. 6,396,492, 6,724,393, 6,826,024, and 7,042,458. Distance fields are a form of implicit functions that represent an object. A distance field is a scalar field that gives a shortest distance to the surface of the object from any point in space. A point at which the distance field is zero is on the surface of the object. The set of points on the surface of the object collectively describe the boundary of the object, also known as the d=0 isosurface. The distance field of an object is positive for points inside the object, and a negative for points outside the object.

Adaptively sampled distance fields (ADFs) use detail-directed sampling to provide a much more space and time efficient representation of distance fields than is obtained using regularly sampled distance fields. ADFs store the distance field as a spatial hierarchy of cells. Each cell contains distance data and a reconstruction method for reconstructing a portion of the distance field associated with the cell. Distance data can include the value of the distance field, as well as the gradient and partial derivatives of the distance field. The distance field within a cell can be reconstructed only when needed to reduce memory and computational complexity.

Alternatively, the edited shape can be represented implicitly as a composite ADF (CADF). The CADF is generated to represent the object, where the CADF includes a set of cells arranged in the spatial hierarchy. Each cell in the CADF includes a subset of the set of geometric element distance field functions and a reconstruction method for combining the subset of geometric element distance field functions to reconstruct a composite distance field of a portion of the object represented by the cell. Each distance field in the subset of distance fields forms a part of the boundary of the object within the cell, called the composite boundary.

Tool Workpiece Engagement

During milling, as the tool moves along the tool path, the tool is in contact with the workpiece over a common surface which is called an "engagement surface." As the tool moves relative to the workpiece, the tool carves out the swept volume. A portion of the workpiece that is intersected by the swept volume is removed, and called as "removed volume." The workpiece that is updated by the removed volume is called an "in-process workpiece." The engagement surface is the result of an intersection Boolean operation that occurs between the tool and the in-process workpiece.

To model the mechanics of the process, the dynamics, and to perform the machining process optimization accurately, it is necessary to have a precise geometric representation of the engagement surface. One of the inputs to the NC milling process simulation is the geometry of engagement surface between the tool and workpiece. The geometry of the engagement surface can have multiple disconnected sub-surfaces. The milling forces are applied between the tool and the workpiece through this engagement surface. Mechanistic modeling can be used to predict the milling forces, bending moment, spindle torque, spindle power, and tool defections from the instantaneous engagement surface and other parameters such as axial and radial depths, tool thickness, and errors of the surfaces due to tool deflections, parameters defining tool geometry, and milling parameters.

Various methods of determining the engagement surface are known. For example, boundary representation (B-rep) based milling simulation can analytically compute the engagement surface for simple milling tools, and 2.5 axis tool paths. See, Yip-Hoi and Huang: "Cutter/Workpiece Engagement Feature Extraction from Solid Models for End Milling," ASME Journal of Manufacturing Science and Engineering, 2006, and Spence and Altintas: "A Solid Modeller Based Milling Process Simulation and Planning System," Journal of Engineering for Industry, 1994. Both of those methods simulate the milling by a flat-end mill tool, and determine the engagement surface by a B-rep based solution. However, those methods are impractical for complex milling tools and tool paths due to the complexity of the computation and inconsistency of the results.

Several methods approximate the swept volume and engagement surface of the milling tool by polygonal shapes. Those methods include Aras and Yip-Hoi: "Geometric Modeling of Cutter/Workpiece Engagements in Three-Axis Milling Using Polyhedral Representations," ASME Journal of Computing and Information Science in Engineering, 2008, and Yao: "Finding Cutter Engagement for Ball End Milling of Tessellated Free-Form Surfaces," ASME IDETC/CIE 2005. The accuracy of polygonal-based methods is limited by the polygonal representation of the object model. However, millions of polygons may be required to accurately represent the curved surface and removed volume of a complex tool, especially if the radius of curvature is small. Thus, those methods either have limited accuracy or they have prohibitive processing times and memory requirements for calculating high precision tool workpiece intersection properties.

One of the fundamental difficulties has been the accurate and computationally efficient determination of the engagement surface along the tool path. The determination of the engagement surface is challenging due to complicated and changing tool workpiece intersection during NC milling. The geometric properties of the engagement surface comprise angle, area, orientation, curvature, shape, and etc., at any time.

Geometric Properties of Removed Volume

The simulation of the milling requires an accurate modeling of the material removed by the milling tool due to each tool movement. Accordingly, there is a need to determine the removed volume or an accurate geometric representation of the removed volume. Currently, CAD/CAM systems that generate tool path information employ the geometric and volumetric analysis to select parameters of a simulation and cutting. Average milling forces are assumed to be proportional to the material removal rate (MRR) at any particular time.

Volume computation of solid bodies is fundamental in many CSG applications. An overview of the importance and challenges in volume computation is described by Lee and Requicha in "Algorithms for computing the volume and other integral properties of solids. I. Known methods and open issues," Communications of the ACM, 1982. Determining accurate moments and volumes of solids removed by milling tool along the tool path is difficult due to the presence of curved freeform surfaces. Therefore, the volumes are currently being computed by commercial software by first evaluating and tessellating the surfaces and computing the volumes of the tessellated objects as described in "ACIS Geometric Modeler: User Guide v20.0," 2009, Spatial Corporation.

Another common method for volume calculation is converting the volume integrals to surface integrals by using a divergence theorem. That approach is described by Gonzalez-Ochoa, McCammon and Peters in "Computing moments of objects enclosed by piecewise polynomial surfaces," Journal ACM Transactions on Graphics, 1998. Polyhedral approximations indicate that accurate evaluation of integral properties of curved objects via polyhedral approximations may require the use of polyhedral with a large number of faces. Numerical integration techniques are used to evaluate surface integrals of for a given polyhedral approximation. However, one of the main limitations is the level of tessellation in order to guarantee the accuracy of result.

Cellular approximations by using regular or octree subdivision are related to voxel-based representations, and these methods have accuracy and memory limited by the size of the smallest voxel used to represent the removed volume. For example, one method uses recursive subdivision surfaces as described by Peters and Nasri in "Computing Volumes of Solids Enclosed by Recursive Subdivision Surfaces," EUROGRAPHICS 1997. That method computes the volume by estimating the volume of the local convex hull near extraordinary point. However the close-form representation of implicit, explicit or parametric forms is not always available, especially in NC milling case.

Milling Process Optimization

The time and cost of milling are key factors in this competitive industry. It is very important and difficult to choose suitable milling conditions to obtain high productivity due to complicated workpiece and geometry of cutter workpiece engagement, and the physics of the process. In complicated milling, it is critical, but often difficult, to select applicable cutting conditions to achieve high productivity while maintaining high quality of parts. Milling process optimization is the selection of machining parameters for a given process to achieve the maximum material removal rates within the process and machine constraints.

In addition computing the removed volume, other geometric properties of the milling process, such as mass, center of mass, surface area, moment of inertia, length, depth, width and thickness can also be computed to use for process analysis as described in U.S. Pat. Nos. 7,500,812 and 5,528,506. The moment of inertia of the removed volume is used for estimating the stresses applied by the milling tool to the workpiece, and later estimating the residual stresses left on the machined surface, spindle power and specific energy of cutting.

Conservative cutting conditions are most frequently used because there was a lack of accurate physical models and efficient optimization tools for the machining processes. The difficulty is most often the complicated surface geometry. Cutting forces acting between the tool and workpiece carry significant machining process information described in U.S. Pat. Nos. 7,101,126, 7,346,423 and 7,047,102. Since production engineers in industry have no scientific tools based on the mechanics of the free-form surface machining in most of the cases, the engineers cannot predict the cutting forces, therefore, there is no choice other than being conservative in the selection of the cutting conditions, such as feedrate value, spindle speed, depth and width of cut.

In planning of the NC machining process, the CAM software has to be conservative most of the time in selecting cutting conditions in order to prevent undesirable results, such as tool breakage, wear, dynamic run-out, deflection, over-cut or under-cut. In the past, the cutting conditions have been specified by an experienced machinist or selected from a machining database manual or handbook. Therefore, the traditional approaches result in a low productivity.

Feedrate Scheduling

The common practice in industry is to select the feedrate to improve productivity. High feedrate values can reduce the time of the machining but can adversely affect machining forces, tool deflections, surface form errors and wear on the tool and machine. The effectiveness of machining process is generally evaluated by the volume of the material being removed in a given time, often denoted as the material removal rate. The feedrate scheduling strategies can be classified into two groups: online and offline methods The online methods, as described in "Feed rate optimization based on cutting force calculations in 3-axis milling of dies and molds with sculptured surfaces", Int J Mach Tool Manufacturing 34, 1994, analyze the machining conditions through the measurement of tool deflection, cutting forces/torque, vibrations, chatter, temperature, spindle power, motor current. Machining parameters are consistently varied, based on the continual measurement of cutting zone parameters with the help of sensors. However, the sensors may not sufficiently accurate to work in adverse conditions.

As opposed to the online methods, the offline methods are flexible and versatile. The machining conditions can be obtained by means of a computer simulation. The models in "A solid model-based milling process simulation and optimization system integrated with CAD/CAM", Journal of Materials Processing Technology, 2003 and "Solid modeling for optimizing metal removal of three-dimensional NC end milling", Journal of Manufacturing Systems, 1988 used in offline method can be classified extensively into several categories.

The first category uses volumetric models where the feedrate is proportional to either an average material removal rate (MRR). The power required to cut the material is proportion to the volumetric removal rate. It is assumed that the average cutting forces are proportional to the MRR. These kinds of volumetric approaches given in "The implementation of optimum MRR on digital PC-based lathe system", Int Journal Adv. Manufacturing Technology, 2007 predict average forces, not the peak or the instantaneous forces. The feedrate scheduling is performed by using geometrical information such as chip cross section, chip volume and engagement angles. The swept volume for each NC block segment is the average MRR, and the average MRR may be very different from the peak MRR.

The second category uses a rule based model that implements the principles of artificial intelligence techniques, genetic algorithms, response surface, empirical relations between force and process conditions. Another method uses a physical model of the interaction between the tool and workpiece. That physical model predicts the cutting load by using a force model and adjusts the parameters accordingly. The force models are generally accurate, but difficult too difficult to be determines for general cases.

Some offline feedrate scheduling strategy arranges the constant feedrate values in order to increase the resultant force to the desired reference value using a linear relation between the feedrate and the reference limiting cutting force. These feedrate scheduling methods adjust the feedrate to limit force, as described in "U.S. Pat. Nos. 7,050,883" and "U.S. patents No. 20050113963," however, those methods are still insufficient for determining the best optimized feedrate values.

Thus there is a need for a method for scheduling the feedrate values to improve the productivity and cycle times.

SUMMARY OF THE INVENTION

Various embodiments of the invention are based on a realization that the feedrate should be determined uniformly for the entire path or for each NC segment of the path may not be optimal due to a possibility of abrupt variation of a shape of the workpiece. It is further realized that optimality of the feedrate can be increased when the feedrate is determined based on the engagement of the tool and the workpiece.

Accordingly, one embodiment of the invention describes a method for determining a feedrate of a tool machining a workpiece according to a path. The method partitions the path into a set of segments, such that within each segment a function of engagement of the tool and the workpiece is substantially constant. The feedrate is determined for each segment in the set.

In various embodiments, the function of engagement includes one or combination of an engagement surface, an engagement area, an engagement angle, and removed volume. In some embodiments, the function of engagement also includes a parameter defining a—abrasive resistance of a material of the workpiece to the machining. These embodiments can account for a variation of the material of the workpiece to be machined.

Another embodiments discloses a simulation system for determining a feedrate of a tool during a simulation of a machining of the workpiece by a motion of the tool according to a path, wherein the workpiece is represented by a model of the workpiece including an object distance field defining a surface of the workpiece, the tool is represented by a model of the tool including a tool distance field defining a surface of the tool, and the motion is represented by at least one swept volume including a swept volume distance field defining a surface of the swept volume, the path is represented by a parametric function.

The simulation system includes a processor for determining a function of engagement of the tool intersecting the workpiece at an instant of the simulation based on distance values between a set of points arranged on the surface of the tool and a surface of an in-process workpiece defined by the object distance field modified by the swept volume distance field at the instant of the simulation to produce a variation of the function of engagement, partitioning the path into a set of segments according to the variation of the function of engagement, such that, within each segment, the variation of the function of engagement is within a predetermined range; and for determining a feedrate for each segment in the set.

BRIEF DESCRIPTION OF THE DRAWINGS

FIGS. 8B and 8C are diagrams of method for determining a removed volume, in-process workpiece and engagement surface between a tool and in-process workpiece according to embodiments of an invention;

FIG. 8D is a perspective view showing the engagement surface and angle of engagement on the tool boundary;

FIG. 8E is a top view corresponding to FIG. 4D;

FIG. 12A is a diagram of initial workpiece and a flat-end mill tool;

FIG. 12B is a diagram of in-process workpiece and tool time showing a state of milling performed by the flat-end mill tool;

FIG. 12C is a diagram of tool time and points corresponding to the engagement surface;

DETAILED DESCRIPTION OF THE PREFERRED EMBODIMENT

System and Method Overview

Figure 1:
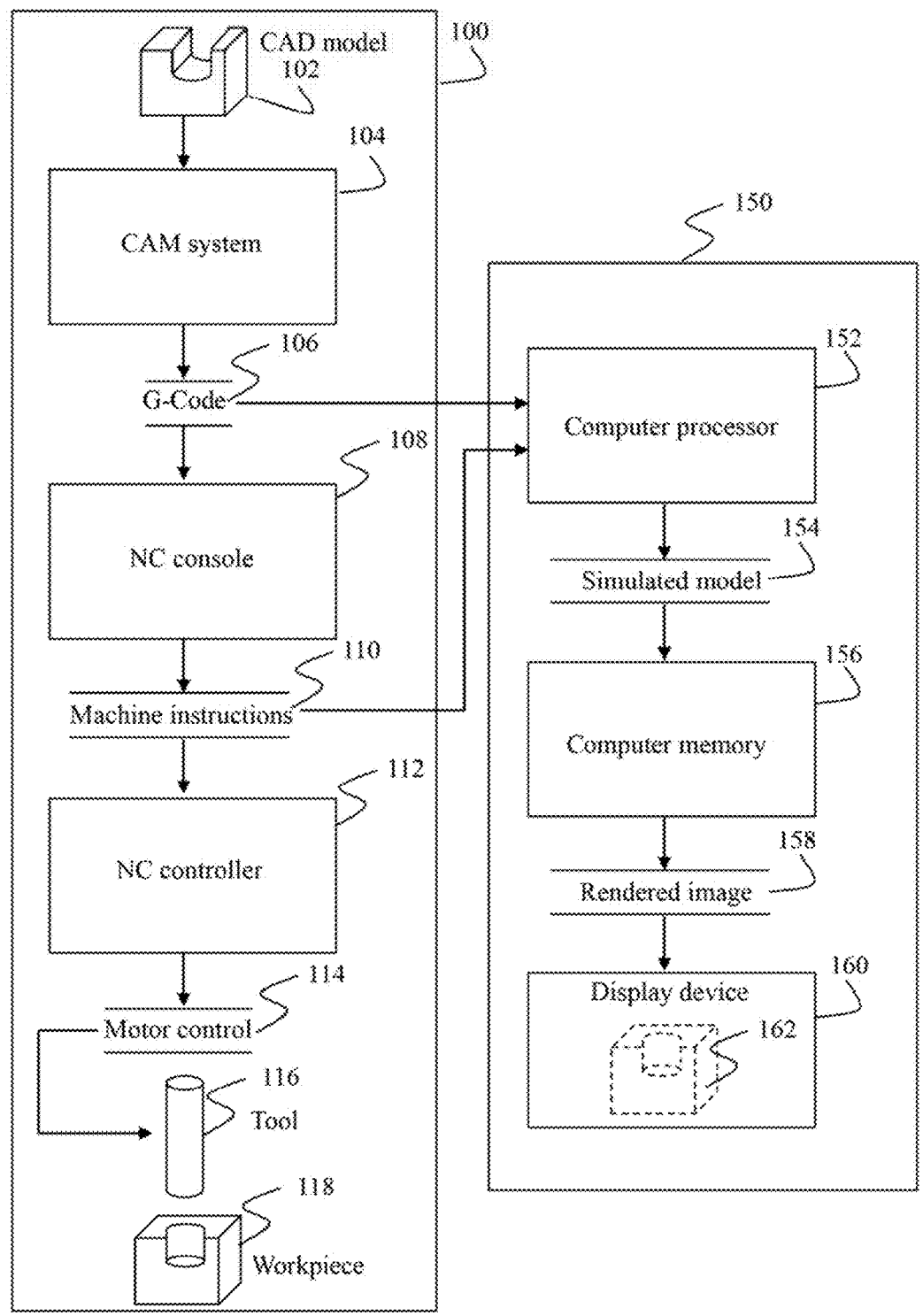
FIG. 1 is a flow diagram of an NC milling machine and a system and method for simulating NC milling according to embodiments of the invention.

FIG. 1 shows an NC milling system 100, and a numerically controlled (NC) milling simulation system 150. In the NC milling system 100, a computer aided design (CAD) model 102 is input to a computer aided manufacturing (CAM) system 104, which generates G-Codes 106 for controlling a NC milling machine. During NC milling, the G-Codes are input to a NC milling input interface 108, which processes each G-Code to produce a corresponding set of NC machine instructions 110. The NC machine instructions are input into an NC controller 112, which produces a set of motor control signals 114 to move a tool 116 relative to a workpiece 118 in order to mill the workpiece.

The simulation system 150 can take as input either the G-Codes 106 generated by the computer aided manufacturing system 104, or the NC machine instructions 110 generated by the NC console 108. The input to the simulation system is read by a computer processor 152, which simulates machining of the workpiece, and outputs a simulated model 154, which can be stored in a computer memory 156. The processor 152 can render the stored simulated model 154 to generate a rendered image 158 which can be output to a display device 160. A displayed image 162 can be compared to the computer aided design model 102 to verify the G-Codes 106 or NC machine instructions 110 prior to performing the actual NC milling of the workpiece.

In various embodiments of the invention, the simulation system 150 determines a feedrate of the tool machining the workpiece. A feedrate is the velocity at which the tool is fed, that is, advanced against the workpiece. The feedrate can be expressed in units of distance per revolution for turning and boring (typically inches per revolution [ipr] or millimeters per revolution). Thus, the feedrate can also be expressed for milling. The feedrate is often expressed in units of distance per time for milling (typically inches per minute [ipm] or millimeters per minute.

Figure 2A:
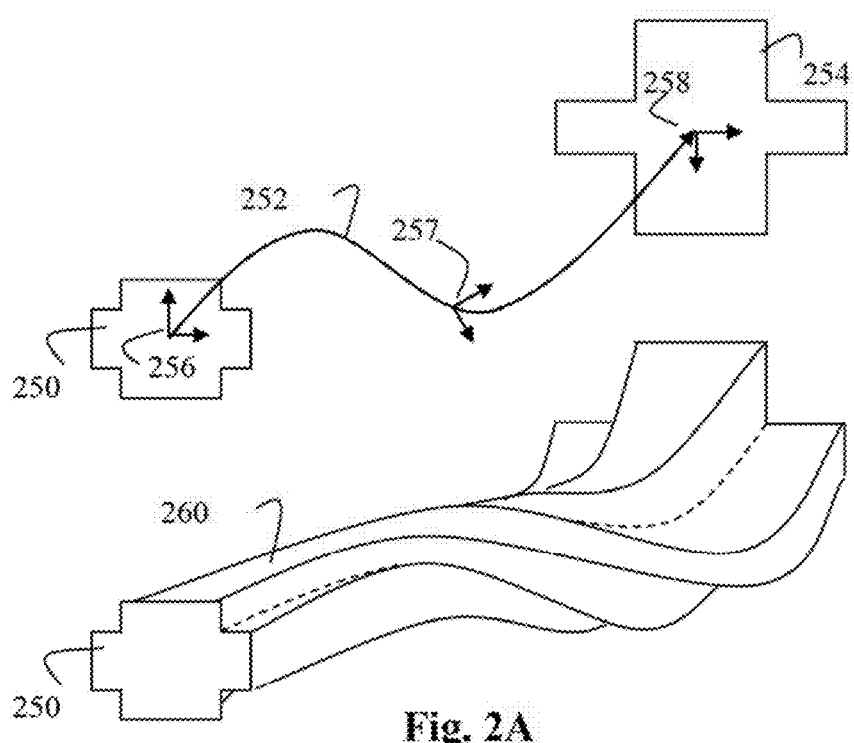
FIG. 2A is a schematic of a swept volume determined by sweeping a 2D shape along a curved path.

FIG. 2A shows the swept volume 260 of a shape 250 that is moved along a path 252. The path 252 specifies a position of a particular point of the shape 250 as a function of time. The path can specify an orientation 256, 257, and 258 of the shape as a function of time. The path can also specify a scale of the shape or an arbitrary transformation of the shape as a function of time. The original position, orientation, and geometry of a shape 250 are transformed to a final position, orientation, and geometry of the shape 254 moving along the path.

Figure 2B:
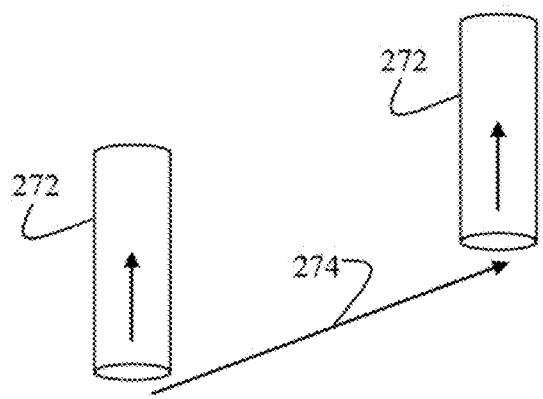
FIG. 2B is a schematic of a linear path of a tool.
Figure 2C:
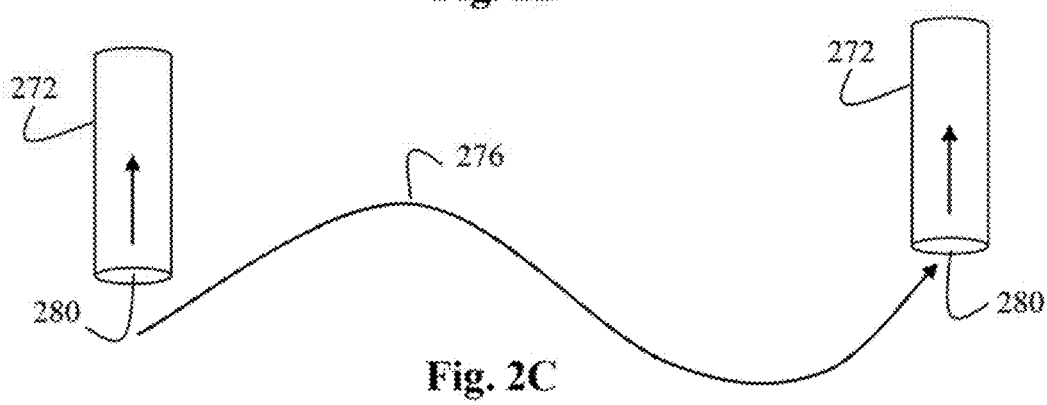
FIG. 2C is a schematic of a curve path of a tool.

The path of the tool relative to the workpiece can be specified in many forms. FIG. 2B shows a linear path for a tool 272 moved along a straight line 274. FIG. 2C illustrates a curved path, in which the tip 280 of the tool 272 is moved along a curve 276. Other possible path forms include positioning the tool at a point, moving the tool along a sequence of lines known as a polyline, moving the tool along a spiral or helical curve, moving the tool along a polynomial curve, such as a quadratic Bezier curve or a cubic Bezier curve, or a sequence of polynomial curves known as a piecewise polynomial curve to name but a few.

The path of the tool is determined by the G-Codes and/or the NC machine instructions. Typically, the path is determined by a set of segments, called herein NC segments, i.e., the segments of the NC tool path. For example, the path of the tool can include positions of the tool at the beginning and at the end of each NC segment.

The length of each NC segment can be uniform or vary depending on the complexity of a shape of the path. It is natural to determine the feedrate for each NC segment or a group of NC segments. However, some embodiments are based on a recognition that the shape of the removed volume can vary abruptly within a NC segment. Thus, determining the feedrate on a NC segment scale can be suboptimal.

Figure 3A:
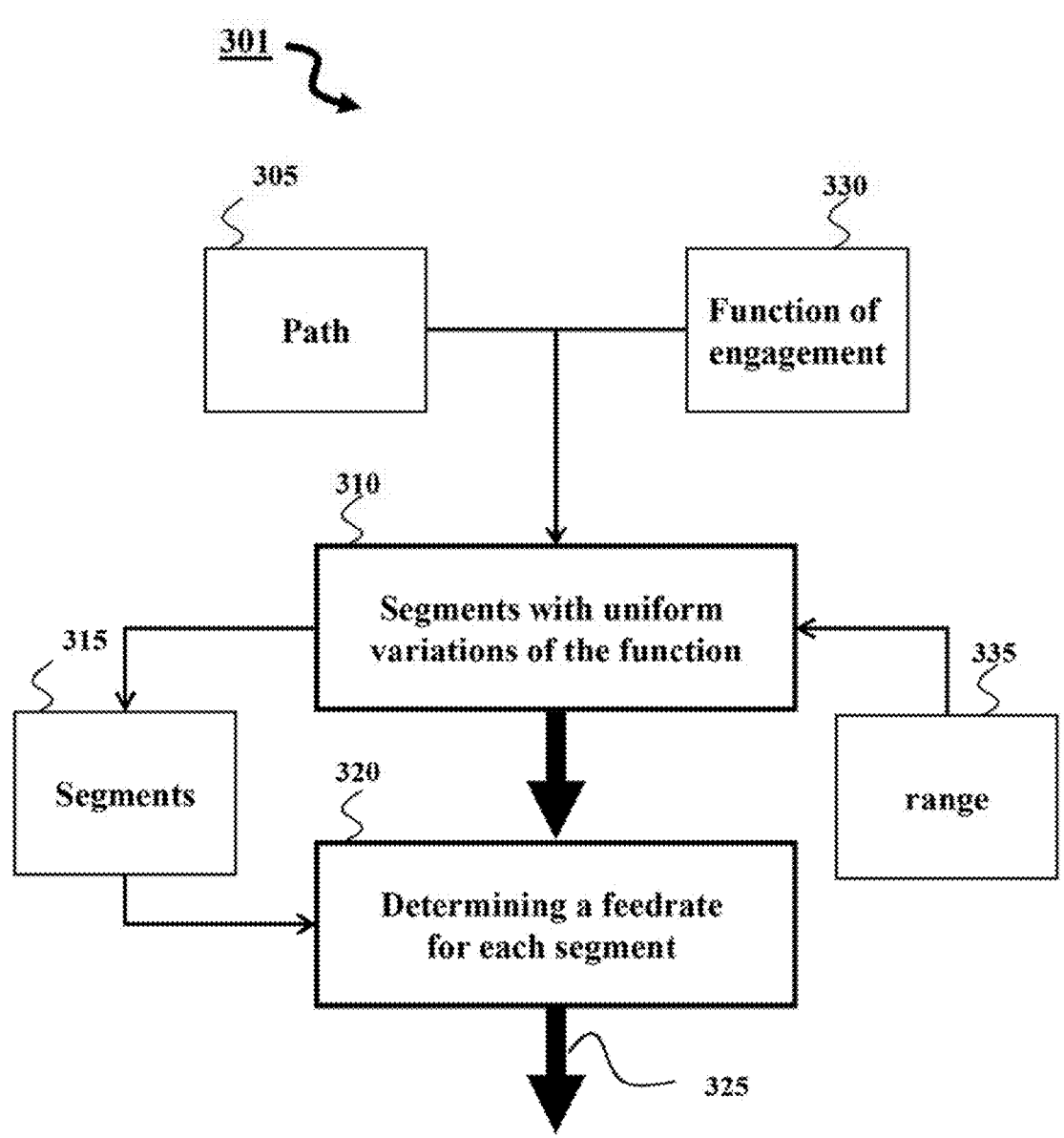
FIG. 3A is a block diagram of a method for determining a feedrate of a tool machining a workpiece according to some embodiments of the invention.

FIG. 3A shows a block diagram of a method according to some embodiments of the invention for determining a feedrate of a tool machining a workpiece according to a path 305. Steps of the method can be performed by a processor 301, which can be a processor of the simulation system 150.

The method partitions 310 the path 305 into a set of segments 315 such that within each segment in the set 315 a function of engagement 330 of the tool and the workpiece is substantially constant. Next, the feedrates 325 are determined separately for each segment in the set 315. Within each segment 315, the feedrate is substantially constant and is optimized for the machining of the segment. As used herein, the substantially constant means that a variation of a value of the parameter is within a predetermined range 335, e.g., defined by a mechanical design of the machining system.

The intuition behind the embodiments is that the feedrate should not be uniforml for the entire path or for each NC segment of the path, but vary based on the engagement of the tool and the workpiece, which affect the optimality of the force of the machining. For example, in various embodiments, the function of engagement includes one or combination of an engagement surface, an engagement angle, and removed volume. In some embodiments, the function of engagement also includes a parameter defining a resistance of a material of the workpiece to the machining. These embodiments can account for a variation of the material of the workpiece to be machined.

In one embodiment, the function of engagement is an engagement surface between the tool and workpiece during the machining of that segment. In this embodiment, the path is partitioned into the segments such that the engagement surface within each segment is substantially constant. This embodiment is based on a realization that the engagement between the tool and the workpiece can govern the optimal possible feedrate of the tool. Such partitioning is generally complex, but can be simplified by using distance fields, as described below.

Figure 3B:
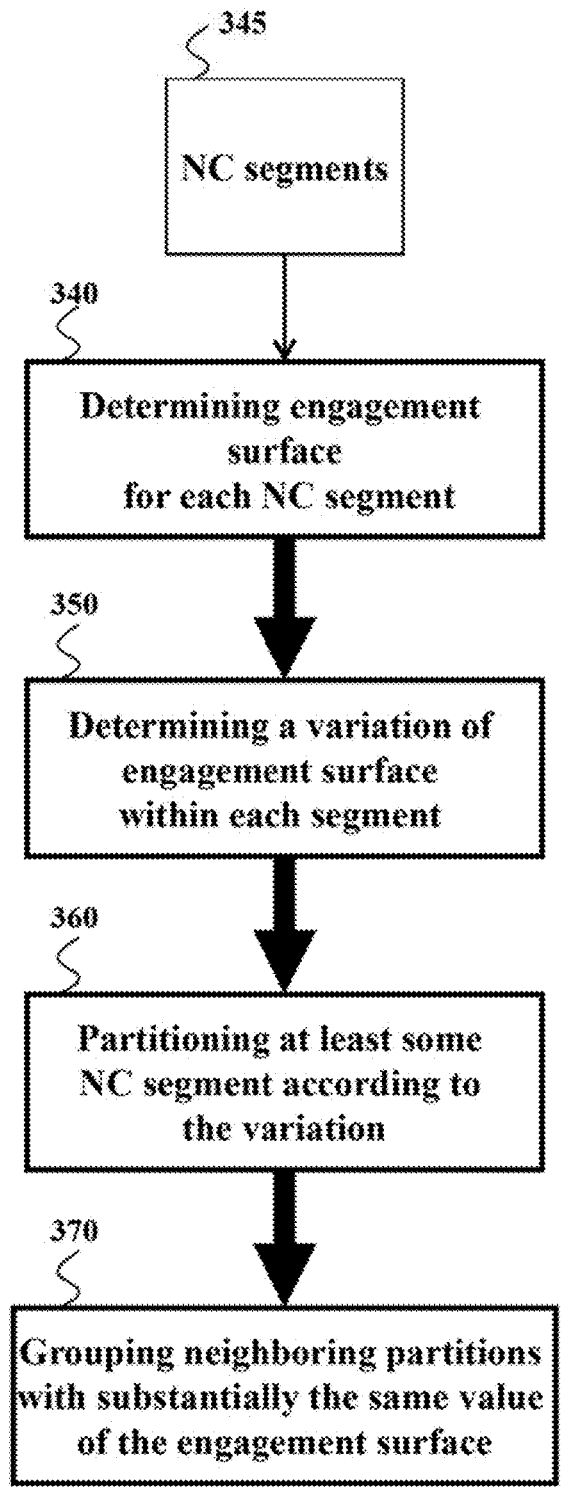
FIG. 3B is block diagram of a procedure for determining a set of segments in the method of FIG. 3A.

FIG. 3B shows a block diagram of an exemplar method for determining a set of segments 315, wherein the function of engagement 330 includes the engagement surface. This method is easily extendable for other variations of the function. The method determines 340 the engagement surface for each NC segment of the path. For example, the method can use ray casting origination from a beginning of each segment, as described below. The variations of the engagement surface within each NC segment are determined 350 and at least some NC segments are partitioned 360 according the variation.

For example, if the variation of the NC segment is within the predetermined range 335, then the NC segment is not partitioned. Otherwise, the NC segment is partitioned such that the variation of the engagement surface within each partition is within that predetermined range. Some embodiments, further test the neighboring partitions from different NC segments for a possibility of grouping the partitions into one segment with substantially constant engagement surface. The neighboring partitions from different NC segments are grouped if a segment formed as a result of the grouping has a variation of the engagement surface within the predetermined range.

Tool Path Partitioning

Figure 4A:
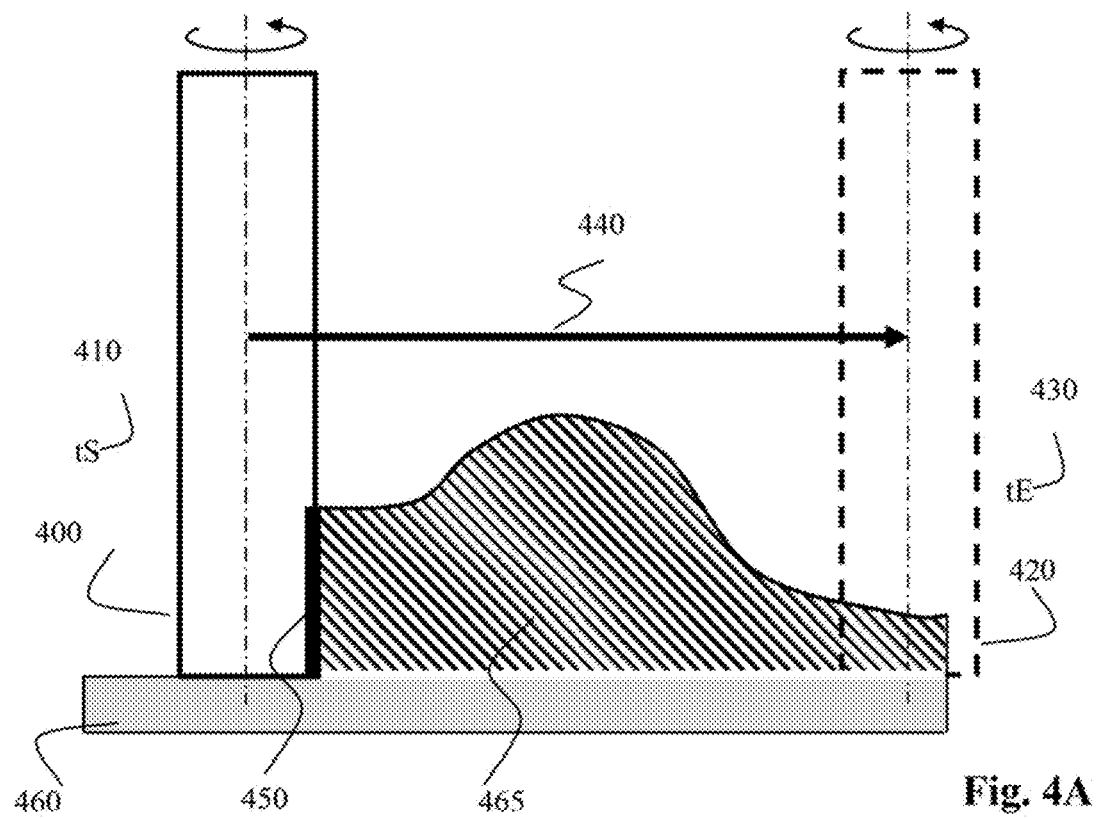
FIGS. 4A and 4B are schematics of methods for partitioning the NC tool path into a set of segments according to some embodiments.
Figure 4B:
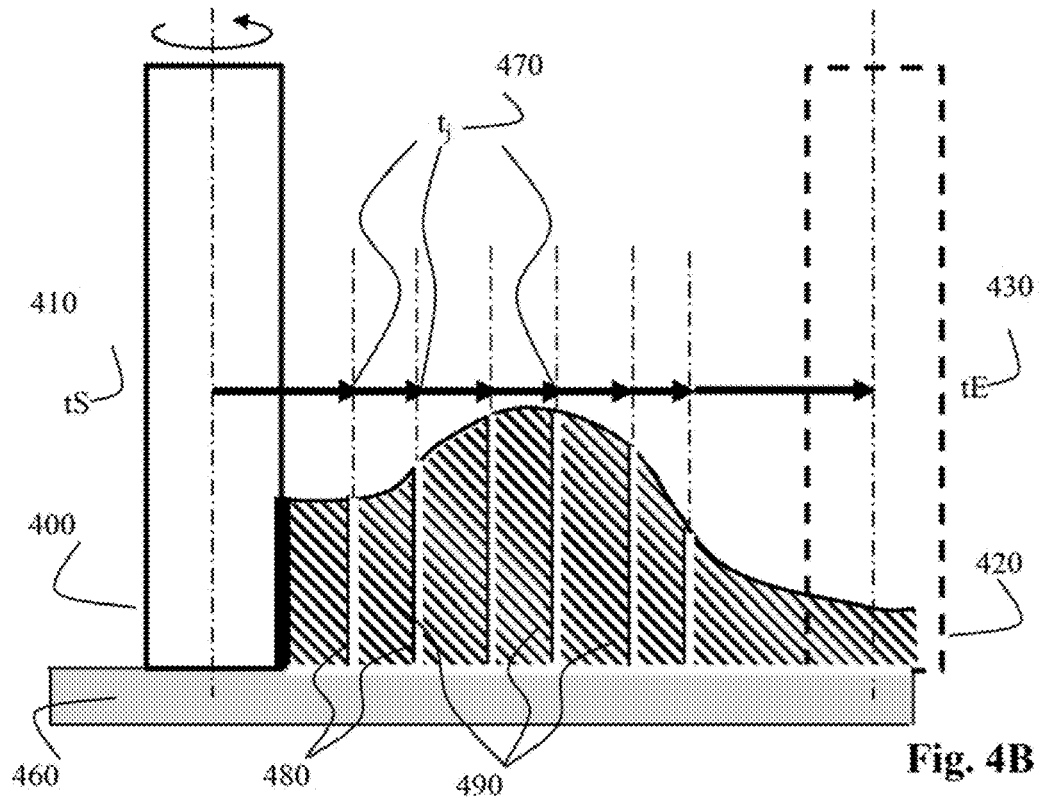

FIGS. 4A and 4B show the side view of an example of a tool motion along a single segment of NC tool path. The milling tool at start time tS 410 moves from an initial position 400 of the tool path to a final position 420 at a time tE 430 along a single NC segment 440 removing the workpiece material 465. FIG. 4A also shows the engagement surface 450 which is determined by intersection between the in-process workpiece 460 and tool in the position 400 at time tS 410. After the swept volume from previous position 400 to next position 4920, the removed volume 465 can be obtained by regularized difference operation.

It is realized that the geometry of the engagement surface can vary abruptly within a single NC segment. Using the same contact surface in each NC segment for milling optimization does not provide the most effective and accurate result. This unexpected variation in the engagement surface may result in a lower or higher material removal rate, and excessive cutting loads, which are harmful for the NC machine.

FIG. 4B shows an example of partitioning the single segment of NC tool path into smaller segments $t_j$ 470, which result in smaller removed volume partitions 490 and variation in the engagement surfaces 480 within a predetermined range. The geometry of the engagement surface between the tool and in-process workpiece can vary significantly in general milling processes.

Figure 5:
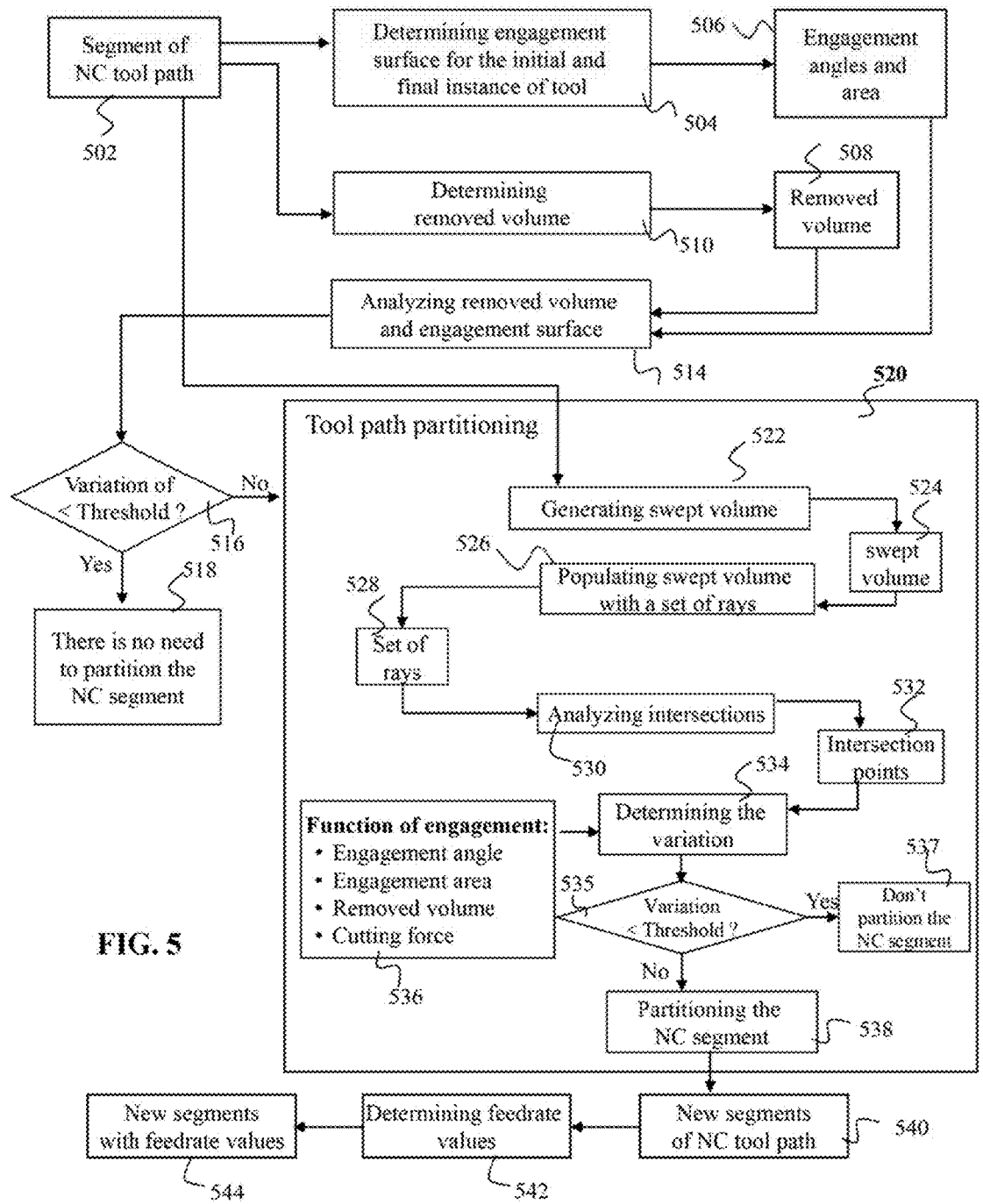
FIG. 5 is a flow diagram of a method for determining the set of NC tool path segments which have uniform variation of a function of engagement between the milling tool and in-process workpiece according to embodiments of the invention.

FIG. 5 is a block diagram of a method for partitioning the tool path into a set of segments during a simulation of a machining according to some embodiments of the invention. In various embodiments, the workpiece is represented by a model of the workpiece including an object distance field defining a surface of the workpiece, the tool is represented by a model of the tool including a tool distance field defining a surface of the tool, and the motion is represented by at least one swept volume including a swept volume distance field defining a surface of the swept volume, as described in more details below.

For a given NC segment 502, the method determines 504 the engagement angles and area 506 for the initial and final time of the NC segment. The method analyzes the volume of material removed by the tool moving along a given NC segment and determines 510 the removed volume 508. The variations of the removed volume and geometric properties of engagement surface are analyzed 514 and compared with a variation threshold 516. If the variation is less the threshold, there is no need to partition the NC segment 518. However, if the variation is larger than the threshold, the NC segment needs is partitioned 520 to have smooth function of engagement variations.

One embodiment partitions 520 the NC segment into a number of smaller segments based on the function of engagement 536. The function of engagement can includes engagement angle, engagement area, removed volume and cutting force. Since the variation of engagement is above the threshold, the tool partitioning first starts with generating 522 the swept volume 524 corresponding to NC segment 502. This swept volume is populated 526 with a set of rays 528.

In one embodiment, the rays are intersected 530 with the in-process workpiece and the intersection points 532 are determined. The number and position of intersection of these rays with the workpiece are analyzed 534 together with the function of engagement 536 to determine the function of engagement at different points along the NC segment to determine the variation of the function of the engagement. The results of the function of engagement at neighboring points are compared to determine the variations of the function of engagement between the points. The variations are compared 535 with the threshold. If the variation is less than the threshold, the tool path segment between the points is not partitioned 537. If the variation is larger than the threshold, the tool path segment is partitioned 538 into smaller segments 540 between the points.

In another embodiment, if the threshold is not satisfied for the segment, then the sampling rate for generating the rays 526 within the swept volume is increased. From the smooth variations of engagement angle, area or removed volume, the cutting forces are calculated to determine the feedrate values 542 for new segments 540. The optimal feedrate values 544 are calculated for the new segments of tool path.

The usage of ray casting allows computing the distances for each point along the ray until the ray intersects the surface. The intersection coordinates along the ray direction indicate how the surface and removed volume vary within the swept volume.

Figure 6A:
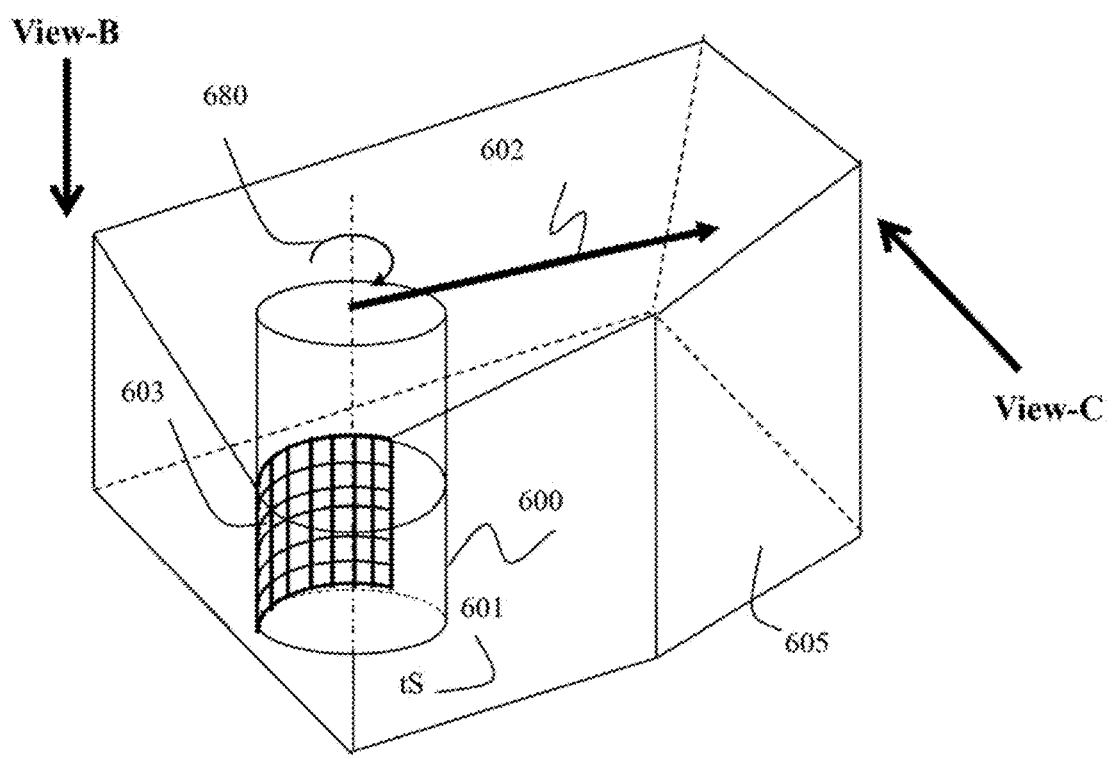
FIG. 6A is a 3D diagram of workpiece, tool and the corresponding NC segment with the engagement surface at the initial time.

FIG. 6A shows an example of simulating the flat-end mill tool 600 rotating in clockwise direction 680, moving along a straight tool path 602, and removing some material from the workpiece 605. The current time of the tool 601 at tS is in contact with the in-process workpiece, the intersection is with the front face of the tool as shown 603.

Figure 6B:
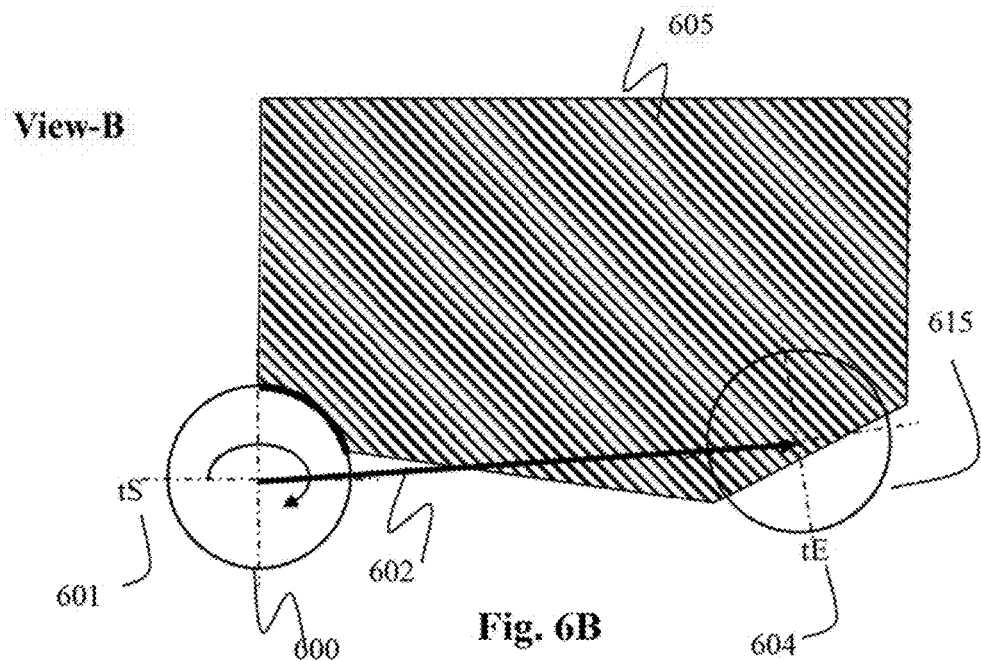
FIGS. 6B and 6C are diagrams of removal process for a tool moving along a single NC segment according to top view-B.
Figure 6C:
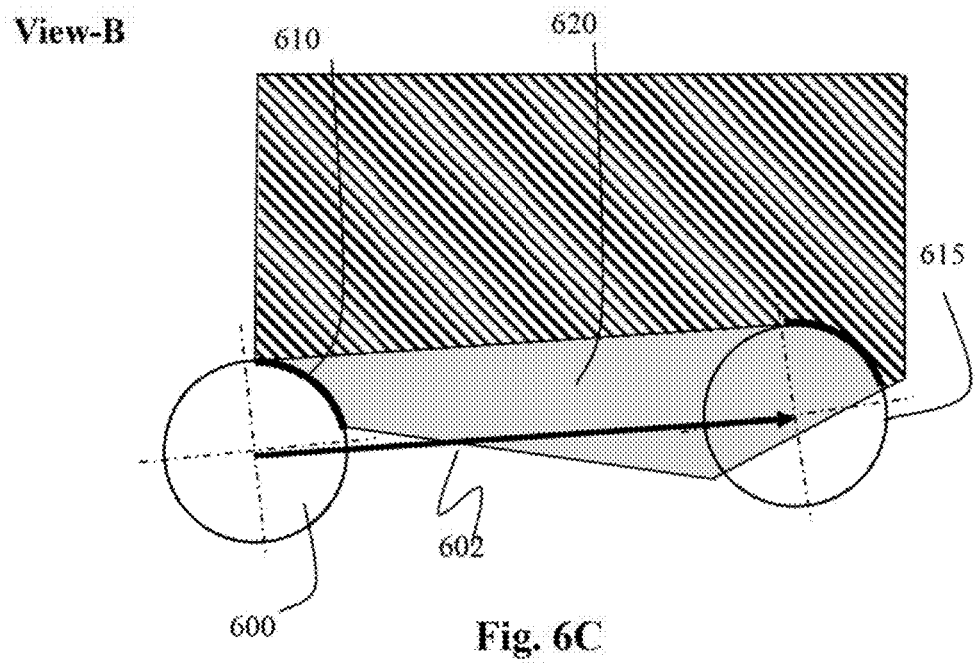

FIG. 6B shows the two-dimensional (2D) top view-B of the in-process workpiece 605 and the current time of tool 600 at tS 601. The tool moves to next time tE 604 along the tool path segment 602. FIG. 6C shows the material 620 removed by the tool path segment 602. Some embodiments determine an area and an angle of the engagement between the tool and the workpiece based on the engagement surface. The angle of engagements for the times tS 601 tE 604 are shown by 610 and 615 respectively. As seen from the removed volume 620 between the tool and workpiece, the radial depth of the cut of the removed volume varies abruptly along the tool path.

Figure 6D:
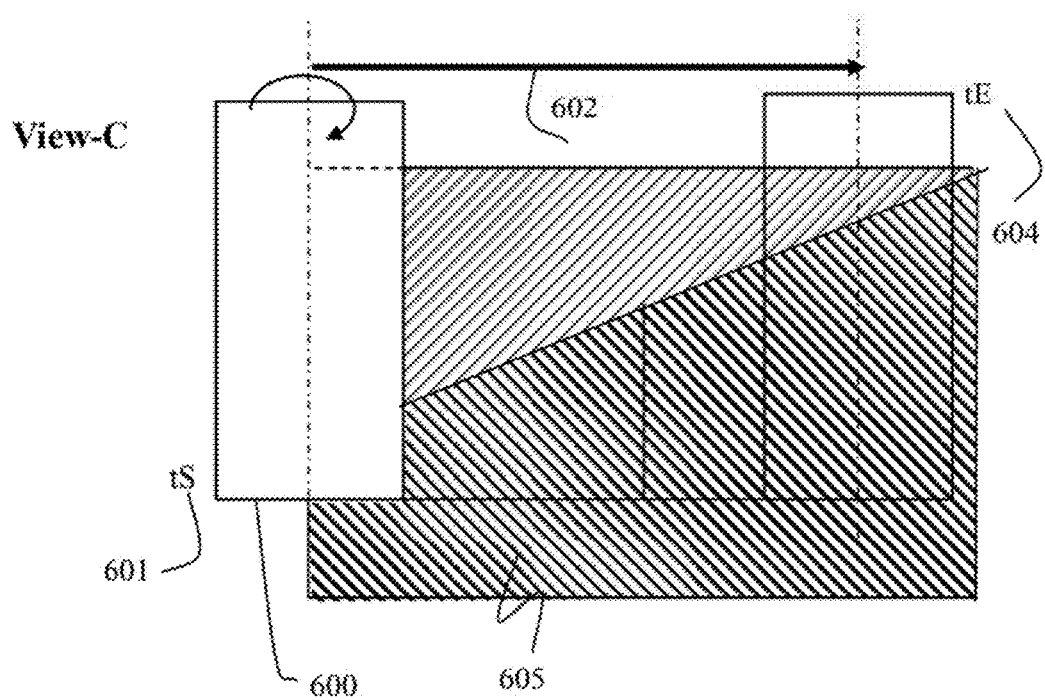
FIGS. 6D and 6E are diagrams of removal process for a tool moving along a single NC segment according to side view-C corresponding to FIGS. 6B and 6C.
Figure 6E:
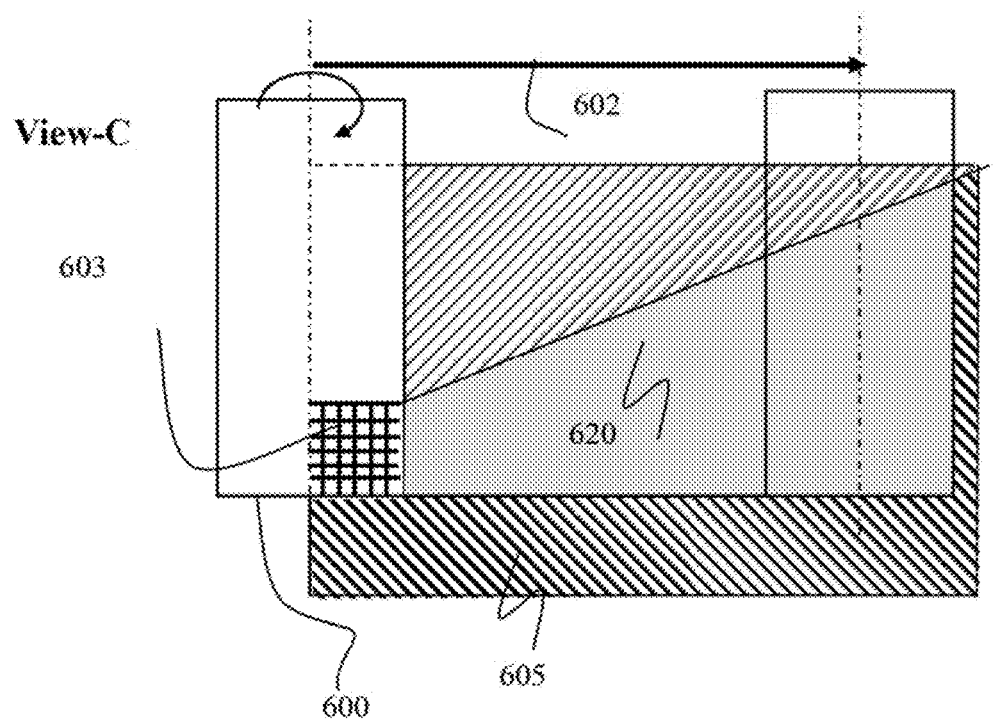

FIGS. 6D and 6E show the two-dimensional (2D) side view-C of the same in-process workpiece 605 and the current time of tool 600 at tS 601. The tool moves to the next time tE 604 along the tool path segment 602. FIG. 6E shows the material 620 removed by the tool path segment 602. Some embodiments determine surface of engagement 603 between the tool and the workpiece. As seen from the removed volume 620 between the tool and workpiece, the axial depth of the cut of the removed volume increases monotonically along the tool path.

Figure 7A:
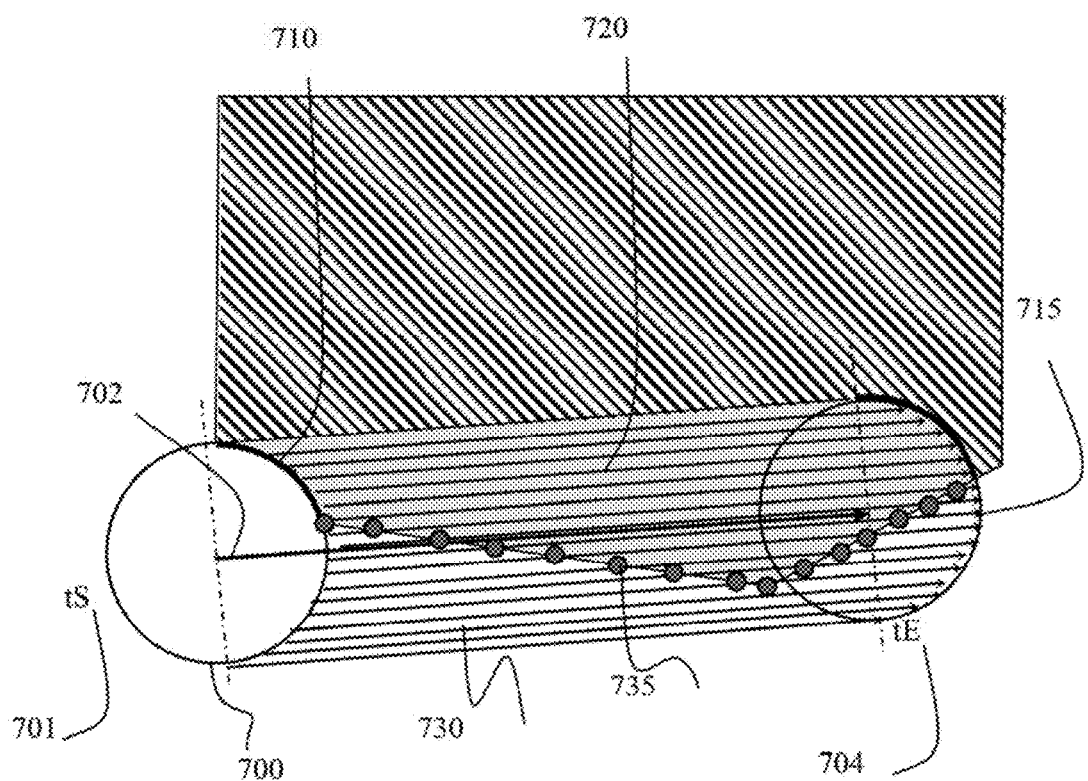
FIG. 7A is a diagram of swept volume, cast rays and the intersection points of rays with the workpiece for the given NC segment.

FIG. 7A shows the swept volume and sampled rays 730 within this volume. The sampled rays 730 within the swept volume are intersected and clipped against the in-process workpiece according to the intersection points 735. These intersection points 735 and their time parameter along the rays are used to partition the tool path segment into set of segments, where each segment has a uniform variation of at least one parameter of cutting, such as engagement angle, removed volume, cutting force.

Figure 7B:
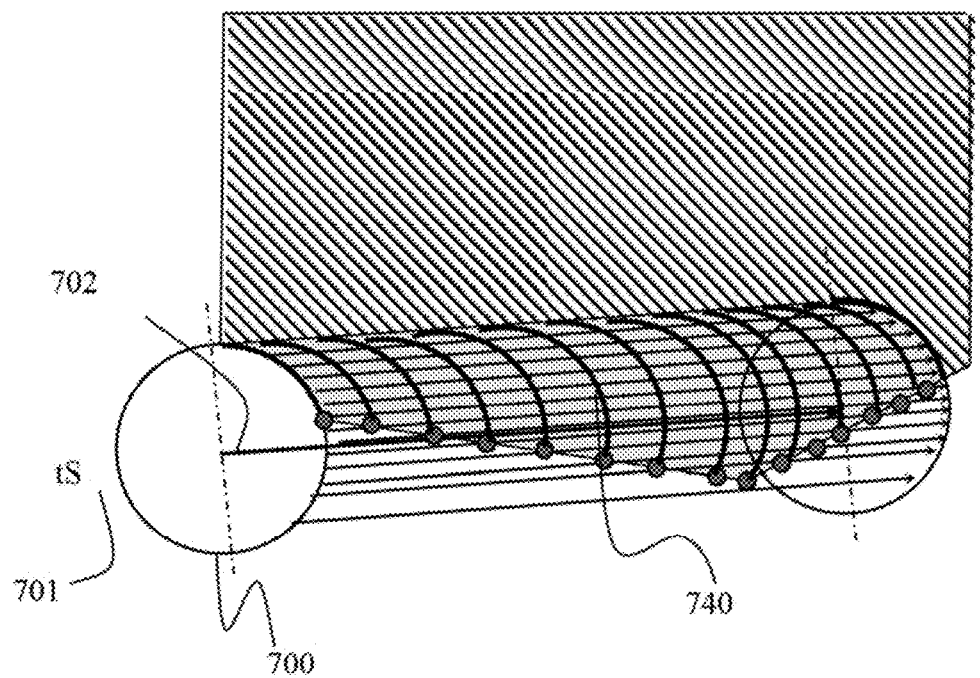
FIGS. 7B and 7C are diagrams of engagement angles between the tool and workpiece, and partitioning the tool segment into finer segments according to some embodiments of the invention.
Figure 7C:
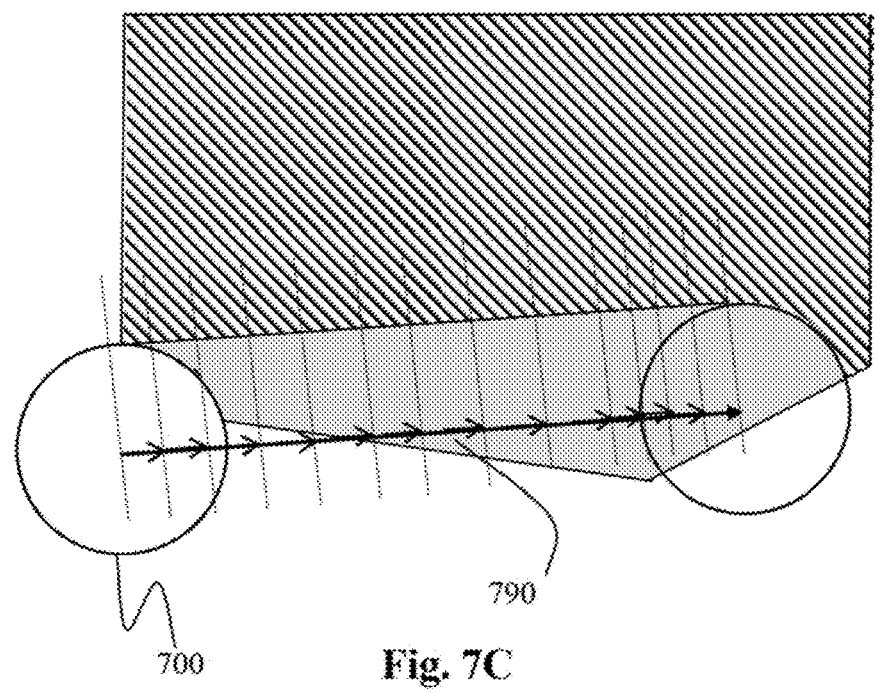

For example, one embodiment shown in FIG. 7B uses the angle of engagement between the tool and the in-process workpiece as the parameter to partition the tool path segment into smaller segments which have uniform variation of engagement angles 740. The new tool paths segments 790 are also shown in FIG. 7C.

Figure 7D:
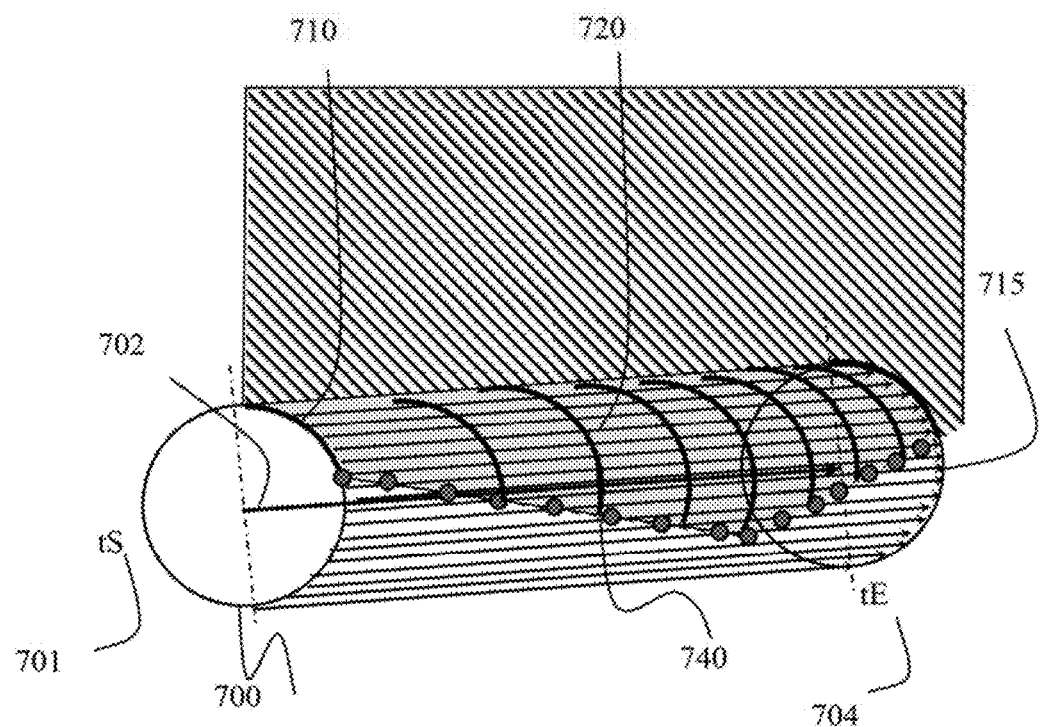
FIGS. 7D and 7E are diagrams of engagement angles between the tool and workpiece, and partitioning the tool segment into finer segments according to some embodiments of the invention.
Figure 7E:
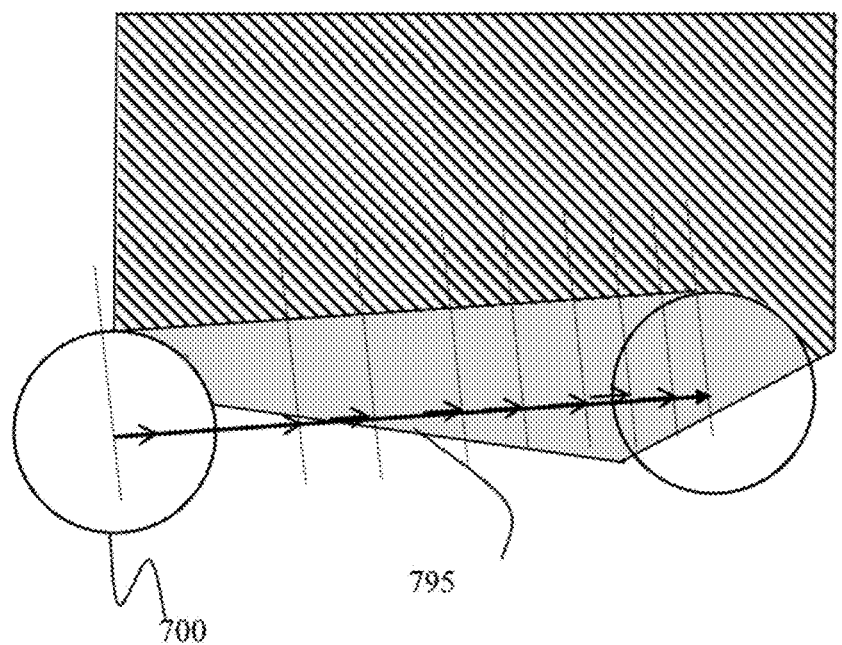

Another embodiment shown in FIG. 7D uses the removed volume as the parameter of cutting to have uniform variation of removed volume along the tool path. The new tool path has less number of segments 795 as shown in FIG. 7E; however the amount of removed volume for each sub-segment varies uniformly along the tool path 702. The uniform variation of material removal corresponds to uniform load variations on the tool.

The method can determine the new tool segments in a continuous manner for an optimal placement of the tool along the path. In some embodiments, the removed volume is partitioned into uniform sub-volumes, which correspond to new tool path segments.

Some embodiments determine the engagement surface for geometric motions of the tool. Additionally, small deflections between the tool and workpiece can be considered. However, the path of motion of the tool is altered when the tool undergoes dynamic displacements where vibration plays an important role in the mechanics of the machining process. In this case, the updated tool path having the dynamic displacements is used to determine the engagement surface. Various embodiments of the invention can be adapted to all physical conditions influencing an accurate representation of an in-process workpiece during simulation.

In addition to computing the removed volume, other geometric properties of removed volume, such as mass, center of mass, surface area, moment of inertia, length, width and thickness can also be computed to use for process analysis. The moment of inertia of the removed volume is used for estimating the stresses applied by the milling tool to the workpiece, and later estimating the residual stresses left on the machined surface.

The implicit representation is advantageous for determining whether a given point lies on a specific curve or surface. This motivates the use of distance fields and ray-surface intersections for partitioning the NC tool path segment into smaller segments. Additionally, the usage of ray casting allows computing the distances for each point along the ray until the ray intersects the surface. Especially, the distance fields differentiate by its sign information whether the point is within the swept volume or not. In some embodiments, the removed volume is represented by a continuous geometric surface along the tool path. However, the sampling of the surface can be difficult when the cross section of volume varies abruptly along the motion. Instead, a lower dimensional geometry, i.e., a line represented by the ray, is used to form the removed volume to avoid the sampling of the surface.

Some embodiments use the engagement surface, the angle of the engagement and depths of the tool to calculate the instantaneous milling forces in, e.g., the radial, tangential, and feed directions. Without the knowledge of the engagement surface, the computation of the milling forces is difficult. Additionally or alternatively, some embodiments determine process parameters by calculating the axial and radial depths and cut or uncut chip thickness.

Engagement Surface and Removed Volume

FIGS. 8A-E shows an engagement surface and removed volume between a model of a tool and an in-process model of a workpiece according to an embodiment of the invention.

Figure 8A:
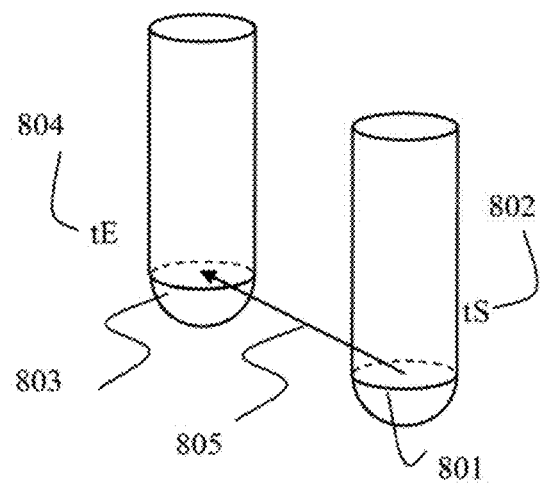
FIG. 8A is a diagram of tool times for a tool path.

FIG. 8A shows a linear tool path, in which a model of a milling tool at start time tS 802 is moved from initial position 801 of the tool path to a current position 803 of tool path at a time tE 804 along a straight line 805 resulting in a swept volume 806.

Figure 8B:
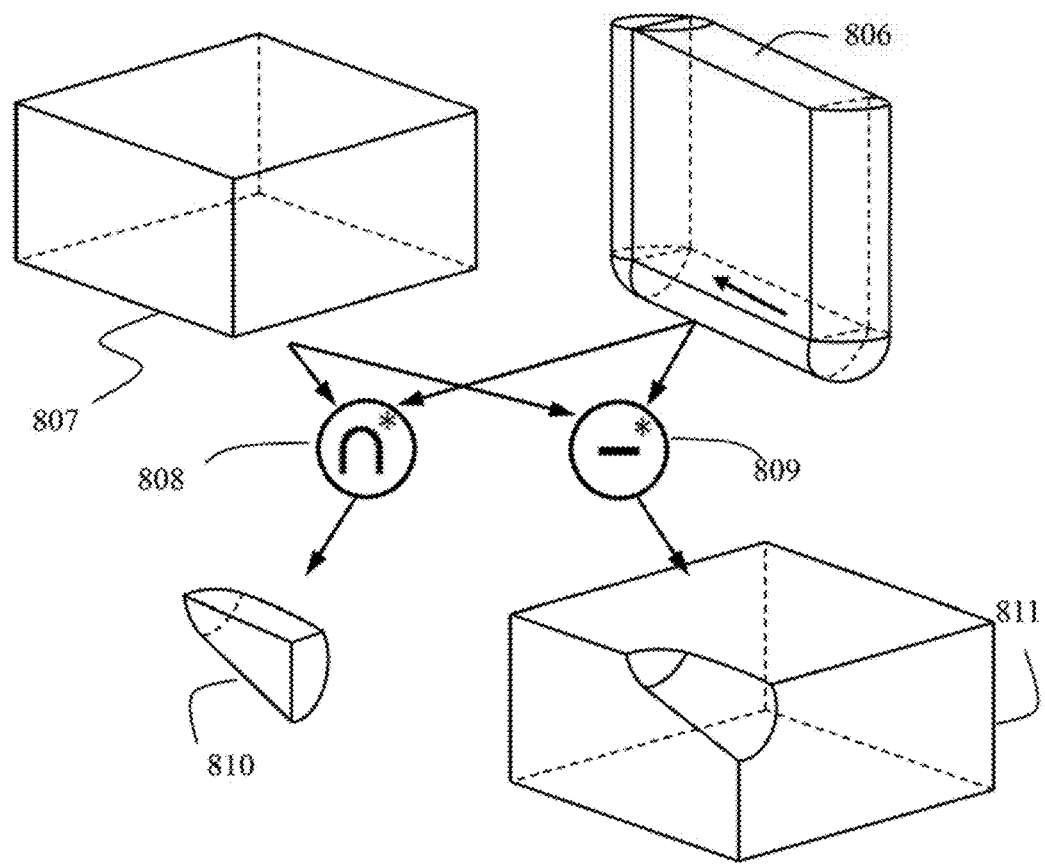

FIG. 8B shows the generation of in-process workpiece 811 and removed volume 810 by performing regularized Boolean intersection 808 and regularized Boolean difference operations 809 between the workpiece 807 and swept volume 806 according to a prescribed tool motion. Regularized Boolean operations ensure that the pair of solids always combines to yield solids.

FIG. 8C shows the engagement surface 813 which is determined by intersection operation 812 between the in-process workpiece 811 and the tool in the position 803 at the time tE 804. This engagement surface defines the instantaneous intersection surface between the model of the tool and the in-process workpiece at each location along the tool path. As used herein, the engagement surface is the instantaneous contact surface between a model of the tool and a model of the in-process workpiece during machining.

FIG. 8D shows the engagement surface 813 on the boundary of the tool in the position 803 at time tE 804. The angle of engagement 814 is calculated by using the determined engagement surface 813.

FIG. 8E shows the top view corresponding to tool and engagement surface given in FIG. 8D. Angle of engagement can be measured from the normal vector 816 perpendicular to tangent tool path vector 815. The entry angle 817 is the angle at which the tool enters the workpiece, and exit angle 818 is the angle at which the tool leaves the workpiece. The angle of engagement is basically the region between the exit and entry angles where the tool actually removes material and creates milling forces.

Figure 9:
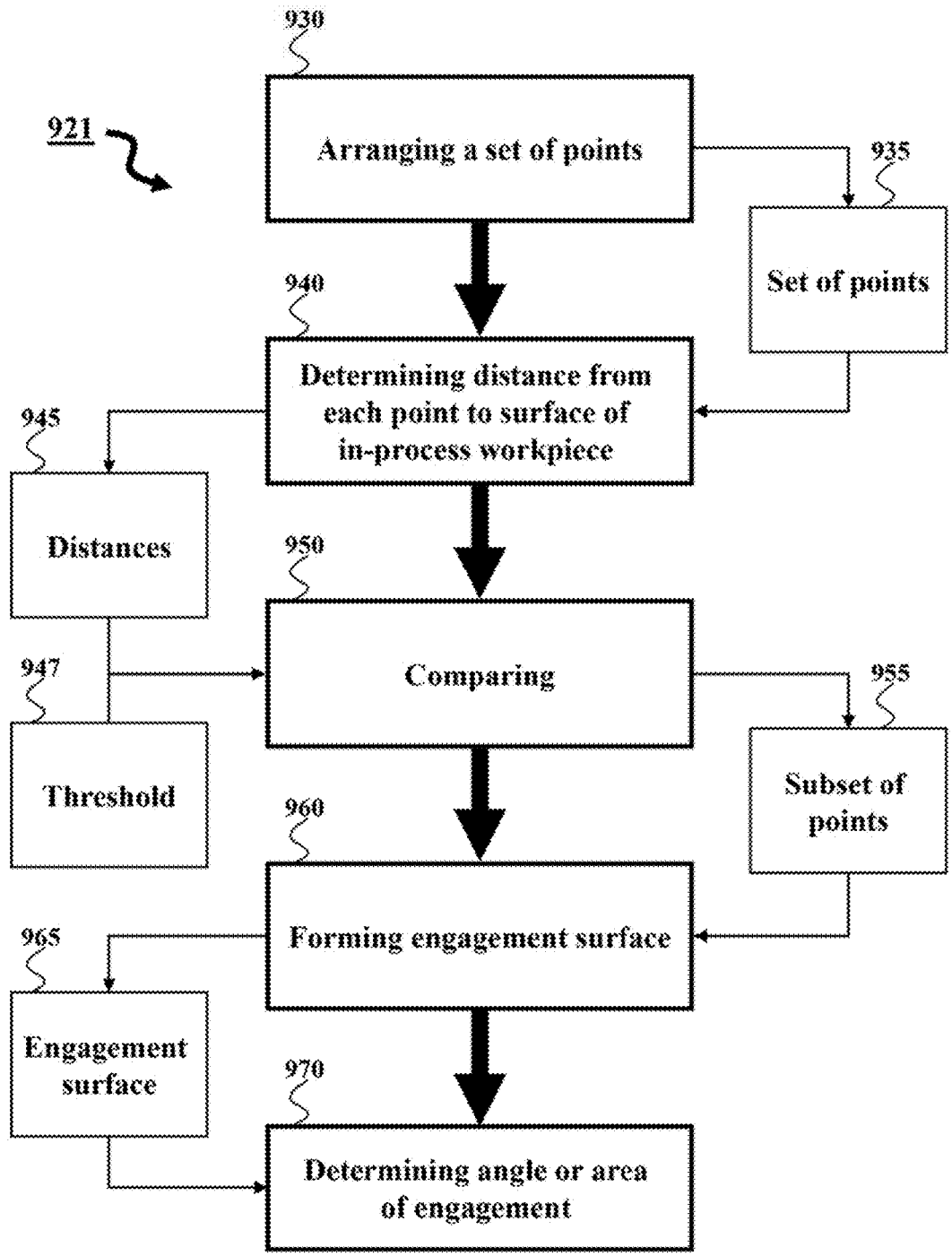
FIG. 9 is a flow diagram of a method for analyzing an engagement between the tool and the workpiece during a simulation of a machining according to some embodiments of the invention.

FIG. 9 is a block diagram of a method for analyzing an engagement between the tool and the workpiece during a simulation of a machining according to some embodiments of the invention. In various embodiments, the workpiece is represented by a model of the workpiece including an object distance field defining a surface of the workpiece, the tool is represented by a model of the tool including a tool distance field defining a surface of the tool, and the motion is represented by at least one swept volume including a swept volume distance field defining a surface of the swept volume, as described in more details below. Steps of the method can be implemented using a processor 921.

A set of points 935 is arranged 930 on at least a part of a surface of the tool. In various embodiments the set of points is arranged according to a sampling pattern, as described in more details below. In some embodiments, the set of points are arranged using various techniques of software engineering and computer graphics. In another embodiment, the set of points is arranged in real time during the simulation without generating a separate data structure.

For each point in the set, a distance 945 between a point and a surface of the workpiece modified by the motion is determined 940, and compared 950 with a threshold 947 to determine a subset of points 955 forming 960 an engagement surface 965. For example, the engagement surface is formed based on the subset of points having the distance below the threshold. Next, in some embodiments, an area and an angle of engagement between the tool and the workpiece are determined 970 based on the engagement surface 965.

Various embodiments of the invention are based on a realization that the swept volume corresponds to a maximal potential removed volume. Therefore, to determine the removed volume, the embodiments test a space internal to the swept volume. For example, various embodiments of the invention cast rays through a space internal to the swept volume, and determine the removed volume based on intersections of the rays with the workpiece inside the swept volume. The populating of volume with rays can be done using various computer graphic techniques and according to various sampling patterns, as described in more details below.

Figure 10:
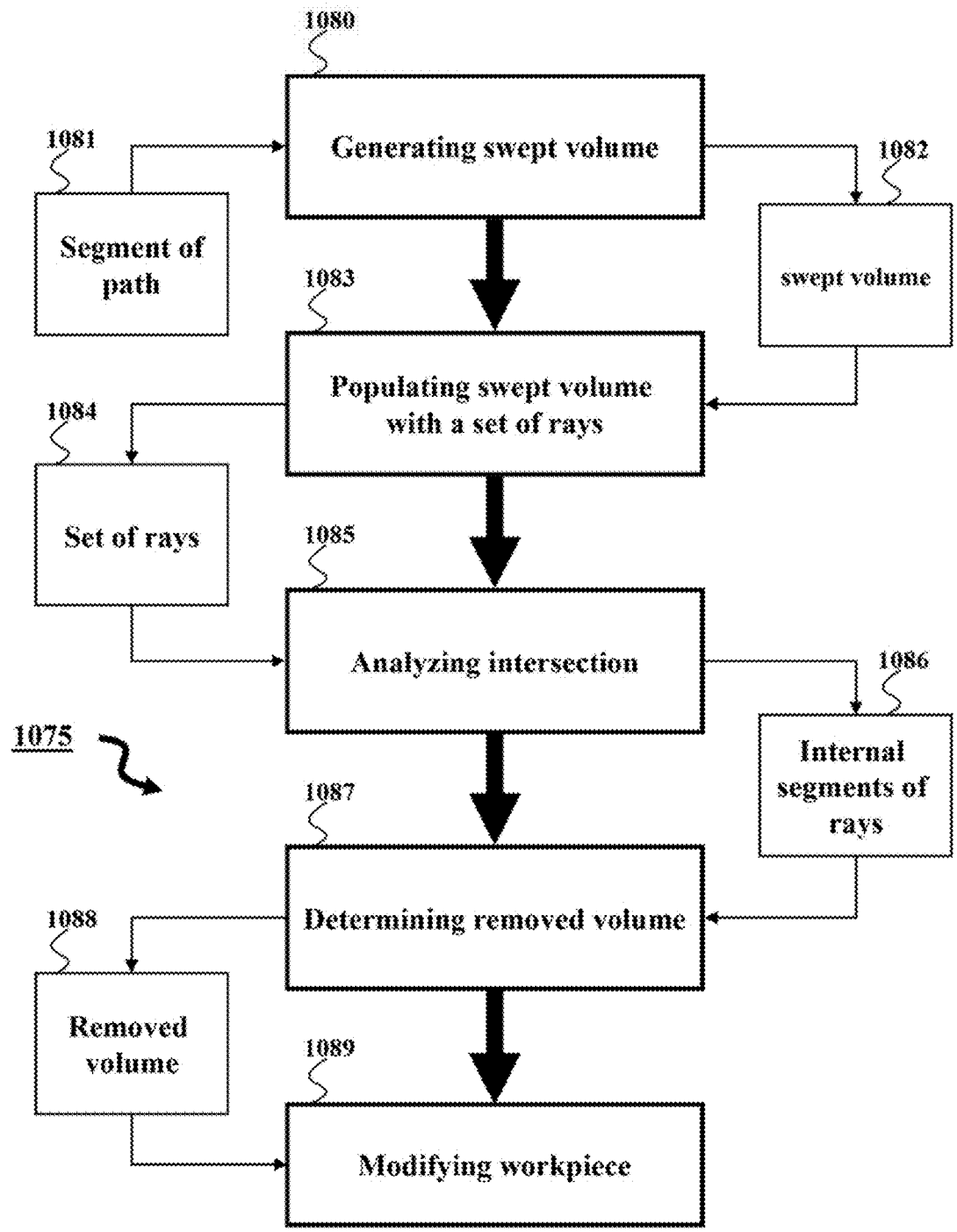
FIG. 10 is a flow diagram of a method for determining the removed volume between the milling tool and in-process workpiece according to embodiments of the invention.

FIG. 10 shows a block diagram of a method for simulating a machining of a workpiece by a tool according to some embodiments of the invention. The method generates 1080 a swept volume 1082 representing a motion of the tool in relation to the workpiece. The motion of tool can be simulated according to a segment 1081 of a path determined for the simulation of the machining. Next, the swept volume is populated 1083 with a set of rays 1084. The intersections of the rays with the workpiece are analyzed 1085 to determine segments of the rays 1086 internal to the workpiece. The volume 1088 removed from the workpiece is determined 1087 based on intersections of at least some rays with the workpiece. For example, the internal segments 1086 of the ray form the removed volume, which can be determined based on a number of the internal segments, distance between the internal segments, and the corresponding length and thickness of the internal segments. The workpiece is modified 1089 based on the volume, such that the machining is simulated. The steps of the method are performed by a processor 1075.

The usage of ray casting allows computing the distances for each point along the ray until the ray intersects the surface. Especially, the distance fields differentiate by its sign information whether the point is within the swept volume or not.

Determining Engagement Surface

Figure 11:
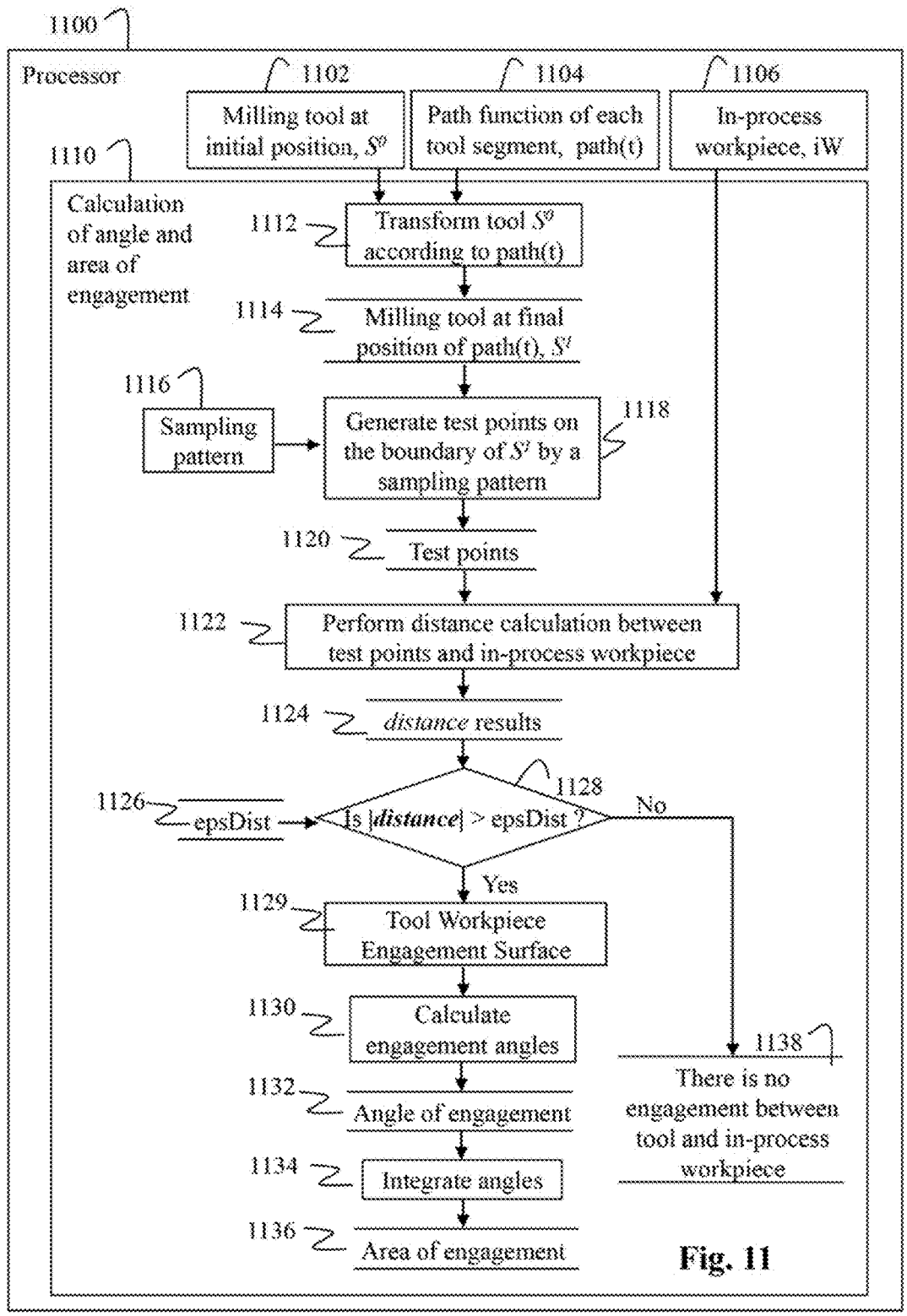
FIG. 11 is a flow diagram of a method for determining the angle and area of engagement between the in-process workpiece and the tool.

FIG. 11 shows a flow diagram of a method for determining the angle of engagement 1132 and the area of engagement 1136 using a processor 1100. Given a tool 1102 and the in-process workpiece 1106 at any time of simulation, and the corresponding tool path segment 1104, the angle and the area of engagement between the tool and the in-process workpiece at given position is determined based on the engagement surface 1129 corresponding to the time of the simulation.

In one embodiment, the tool path segment is parameterized by a single parameter t, which corresponds to time traveled by the tool along the path, and the tool 1102 is transformed 1112 to the end position of tool path segment 1114.

Using a sampling pattern 1116, test points 1120 are determined on the boundary of tool 1118. For each test point 1120, a corresponding distance from the test point to the in-process workpiece 1106 is calculated 1122. The magnitude of the distance 1124 is compared 1128 to the predetermined maximum distance threshold, epsDist 1126. If the absolute value of distance is greater than the maximum distance threshold, the test point is not on the boundary of in-process workpiece. If there are no test points on the boundary of the in-process workpiece, then there is no engagement between the tool and in-process workpiece 1138.

If the absolute value of distance between the test point and in-process workpiece is less than the maximum distance threshold, the test point is on the boundary of the in-process workpiece. The engagement angle 1130 and area 1134 are determined based on the distances of test points to the composite ADF. After all the test points have been processed, the angles of engagement 1132 are determined. Next, the angles of engagement are integrated to calculate the area of engagement 1136.

Various embodiments of the invention use different sampling pattern 1116. In one embodiment, the sampling pattern, for example, is a set of regularly spaced points in a cylindrical coordinate system, wherein points are equally spaced in angle within equally space planes perpendicular to the tool axis. Alternately, the points can be described in a spherical coordinate system in which the points are equally spaced in azimuth angle within planes that are equally spaced in elevation angle.

In some embodiments, the engagement surface represents the geometric information necessary for milling force prediction in NC milling. Therefore, the accuracy of the prediction of the force depends on the accuracy of the angle of engagement determined based on the accuracy and the density of the sampling pattern. For example, when the depth of the tool along the tool path decreases, the contribution of the region close to the tool tip become more important than the case where the depth increases.

Figure 12D:
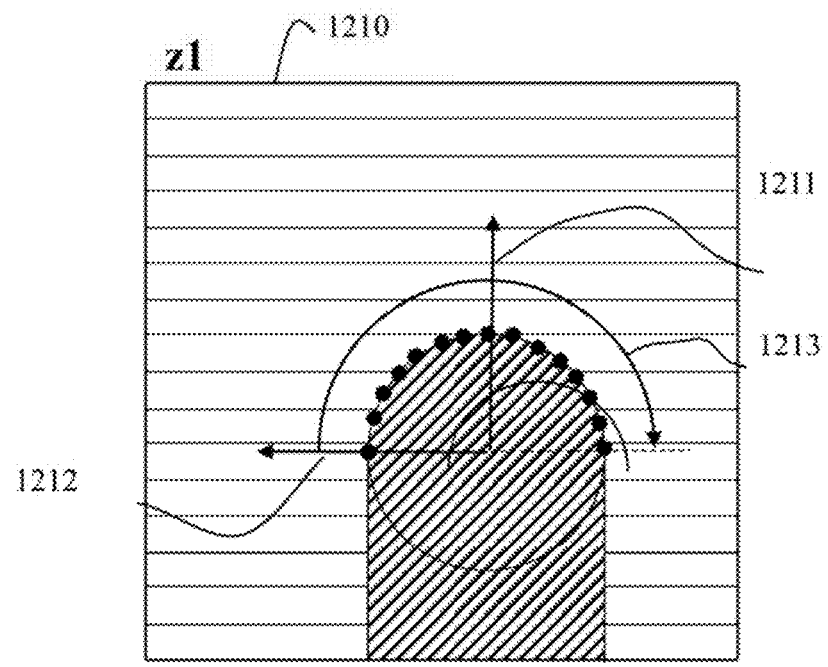
FIGS. 12D and 12E are diagrams of a cross section of an in-process workpiece, showing an entry angle, exit angle and angle of engagement.

FIG. 12A shows an embodiment simulating the flat-end mill tool 1201 rotating in a clockwise direction 1202, moving along a straight tool path 1203, and removing material from the workpiece 1200.

FIG. 12B shows the workpiece 1205 at the current time of the tool 1204. Since the front face of the tool is in contact with the workpiece, the set of points 1208 are arranged only on the front face part of the tool 1204, as shown in FIG. 12C. After determination of a distance between each point in the set of points 1208 and a surface of the workpiece 1205 modified by the motion of the tool, a subset of points 1209 are determined to form the engagement surface.

Figure 12E:
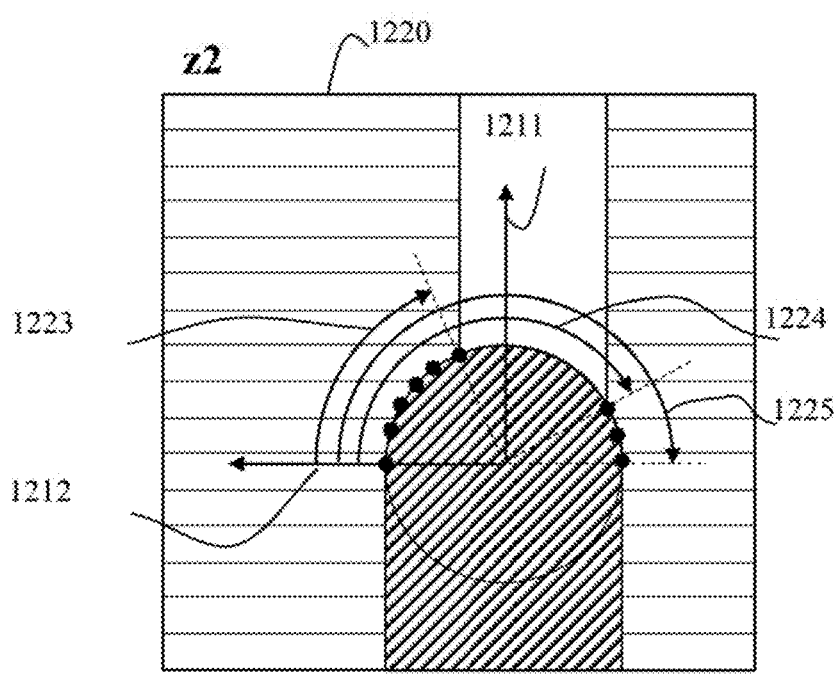

Some embodiments determine an area and an angle of the engagement between the tool and the workpiece based on the engagement surface. For example, one embodiment determines the angle of engagement by using an arctangent function of a tangent tool path vector 1211 and a normal vector 1212. The entry and exit angles of engagement are defined in clockwise direction and measured from the normal vector and where the entry angle is the angle at which the tool begins cutting the workpiece and the exit angle is the angle at which the tool stops cutting the workpiece. For given depths 1206 and 1207, the cross sections 1210 and 1220 of the in-process workpiece are respectively shown in FIGS. 12D and 12E. The entry angle, exit angle and angle of engagement 1213 are 0, 180 and 180 deg. respectively for the cross section 1210 at the depth z1.

During an instant of the simulation, the engagement surface can have one or multiple pairs of entry and exit angles. At the depth z1 1206, the angle of engagement 1213 includes one pair of entry and exit angles, however for the depth z2 1207 and the angle of engagement includes two pairs of entry and exit angles. In the first pair the tool enters the workpiece at an angle 0° and exits at an angel 70° 1223, and in the second pair the tool enters the workpiece at 150° 1224 and exits at an angle 180° 1225. In this example, although the engagement surface is a single surface, different number of pair of entry and exit angles exists for different cross-sections. Also, in various embodiments, the area of the engagement is determined based of a shape of the parts of the engagement surface using appropriate mathematical principles.

Determining Removed Volume

Figure 13:
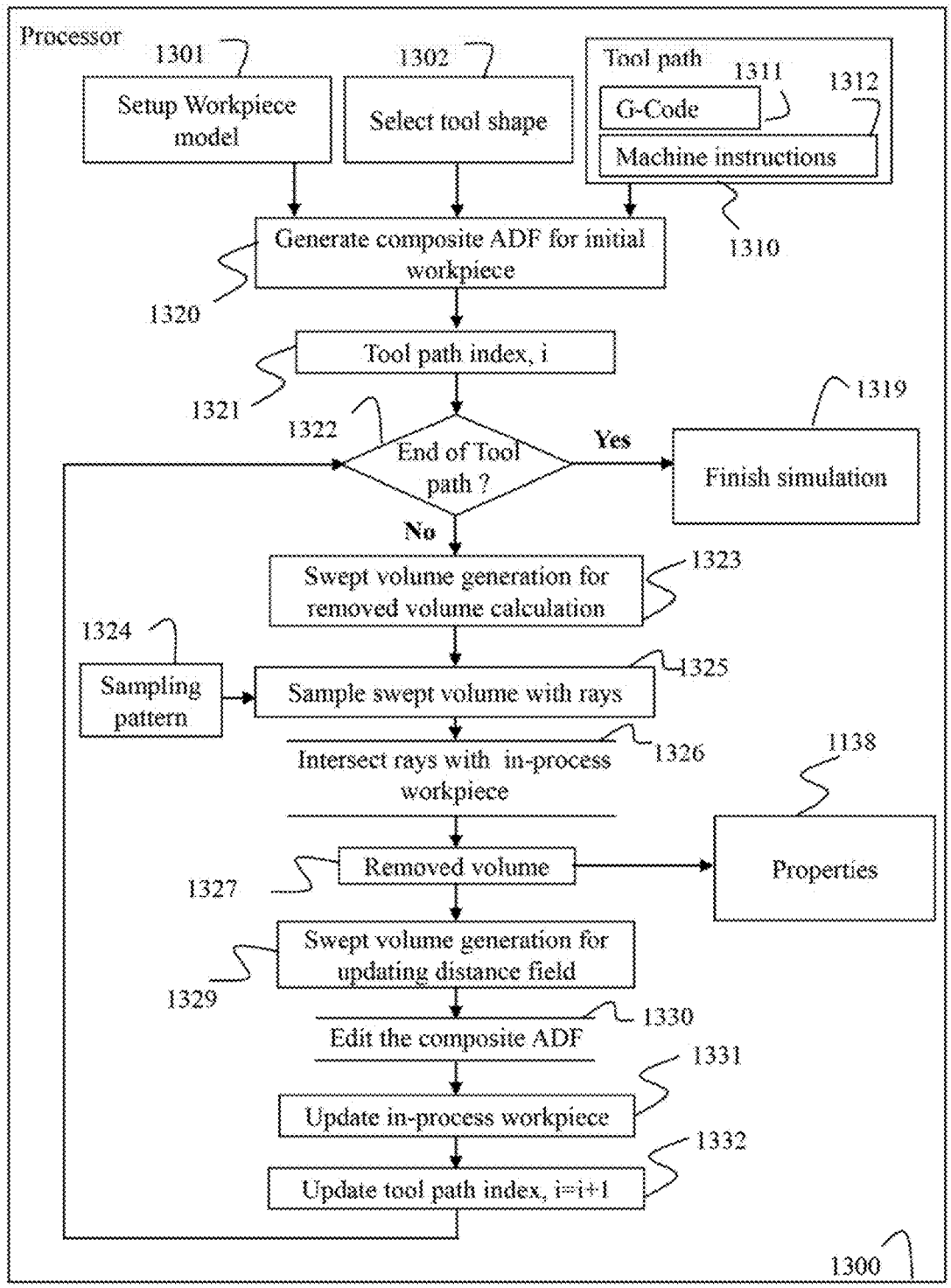
FIG. 13 is a flow diagram of a method for determining a removed volume and its geometric properties according to an embodiment of the invention.

FIG. 13 shows a flow diagram of a method 1300 for determining and analyzing the volume of material removed by the tool moving along a tool path by using the composite ADFs. A model of the workpiece 1301, a shape 1302 of the tool and a tool path 1310 are inputs to the method. The composite ADF is generated 1320 to reconstruct an initial workpiece. The tool path index 1321 is checked 1322 to determine if the current tool time is the final time of the tool path to finish 1319 the simulation. Otherwise, using a sampling pattern 1324, a subset of the swept volume 1323 is populated or sampled with rays 1325.

The generation of swept volumes is done by swept volume distance fields in a continuous manner. A current swept volume corresponding to a segment of the path is sampled 1325 with the set of rays. In one embodiment, the swept volume is modified by taking a Boolean difference of previous tool time from the swept volume.

The rays intersecting 1326 with the workpiece participate in forming the removed volume 1327. Specifically, the rays are clipped against the workpiece according to the intersection test to determine the internal segments forming the removed volume. The internal segments of the rays have corresponding thickness and length, and can be combined to approximate the removed volume. In some embodiments, the collection of the internal segments is processed 1328 to determine various properties of the material removed by the particular tool motion, such as its mass, volume, center of mass, width, thickness, length, inertia tensor or a moment of inertia. These properties can be evaluated by determining a boundary of the removed volume.

After the determination of removed volume for each tool path segment, the composite ADF 1320 is edited 1330 with the swept volume distance field 1329 to simulate the milling of the workpiece with the tool motion. During the editing, the initial workpiece 1320 is updated by the swept volume distance field to obtain in-process workpiece 1330.

Figure 14A:
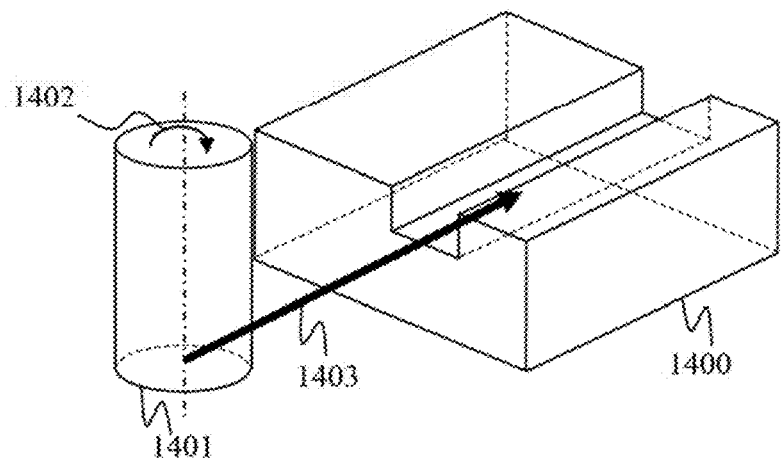
FIG. 14A is a diagram of the workpiece and the flat-end mill tool moving along a tool path.

FIG. 14A shows an embodiment simulating the flat-end mill tool 1401 rotating in clockwise direction 1402. The tool 1401 moves along a straight tool path 1403, and removes some material from the workpiece 1400.

Figure 14B:
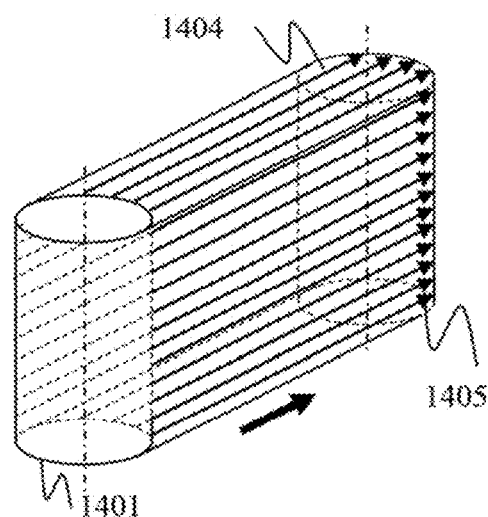
FIG. 14B is a diagram of sampled rays within the swept volume boundary corresponding to tool path segment.
Figure 14C:
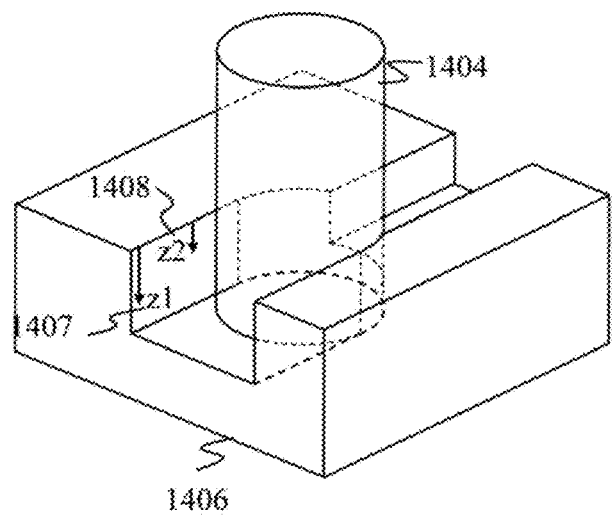
FIG. 14C is a diagram of in-process workpiece and tool time showing a state of cutting performed by the flat-end mill tool.

FIG. 14B shows the swept volume and sampled rays 1405 within this swept volume. FIG. 14C shows the in-process workpiece 1406 and the final time of the tool 1404. The sampled rays 1405 within the swept volume are intersected and clipped against the in-process workpiece. After determination of the internal segments of the rays that are inside the workpiece according to intersection test, the updated ray segments having certain thickness and height are summed to comprise the removed volume.

Figure 14D:
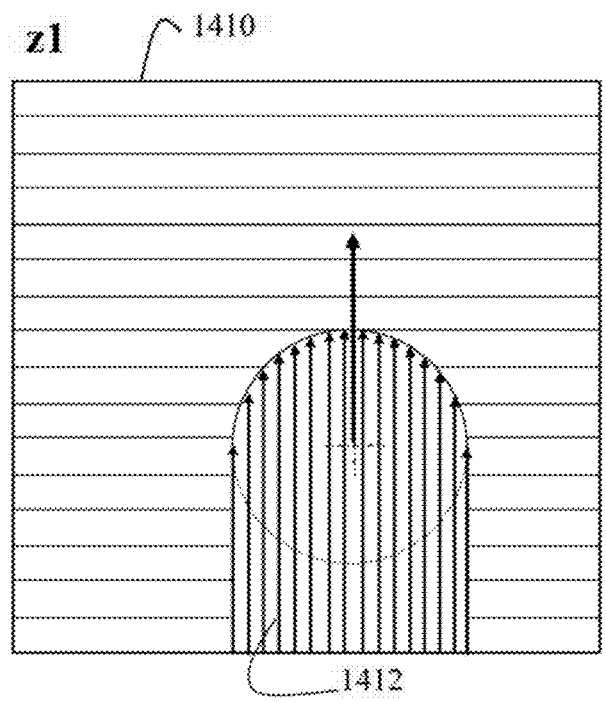
FIG. 14D is the top view of cross section-z1 corresponding to FIG. 14C.
Figure 14E:
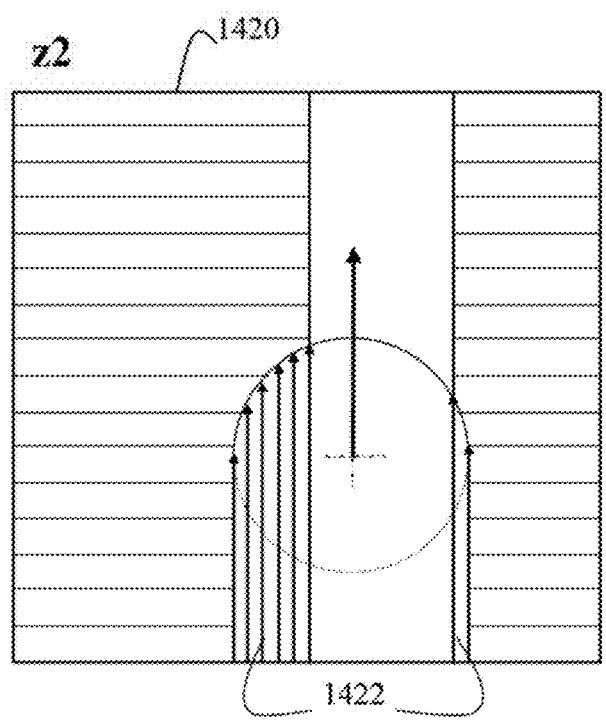
FIG. 14E is the top view of cross section-z2 corresponding to FIG. 14C.

For given depth of depth values 1407 and 1408 of the milling, the cross sections 1410 and 1420 of the in-process workpiece are shown respectively in FIGS. 14D and 14E. The internal segments 1412 and 1422 corresponding to the slices of the removed volume are shown for the given depth of cut values. Although the removed volume for this tool and workpiece is one piece, the removed volume slice 1422 has disconnected pieces.

Operating Environment

Various embodiments of the invention can be operated by numerous general purpose or special purpose computing system environments or configurations. Examples of computing systems, environments, and/or configurations that are suitable for use with the invention include, but are not limited to, personal computers, server computers, handheld or laptop devices, multiprocessor or multi-core systems, graphics processing units (GPUs), application-specific integrated circuits (ASICs), field programmable gate arrays (FPGAs), microcontroller-based systems, network PCs, mainframe computers, distributed computing environments that include any of the above systems or devices, and the like, i.e., generally processors.

For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format. A monitor or other type of display device 160 is connected to any of the above systems to enable visualization 162 of the invention.

Further, a computer may be embodied in any of a number of forms, such as a rack-mounted computer, a desktop computer, a laptop computer, minicomputer, or a tablet computer. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for determining a feedrate of a tool of a milling system, wherein the tool machining a workpiece according to a path obtained by using a processor in connection with a memory and the milling system, such that the tool moves relative to the workpiece and makes contact with the workpiece over an engagement surface, consisting of an engagement area bounded by a tool entry angle and a tool exit angle which together define an angle of engagement of the tool, where the tool removes material, the method comprising the steps of:

partitioning the path of the tool into a set of segments, such that within each segment a function of engagement of the tool and the workpiece is substantially constant, such that the partitioning of the path for each segment is based on a variation of the function of engagement of the tool and the workpiece having a swept volume for an area of the workpiece of that segment, the angle of engagement of the tool contacting the area of the workpiece between a tool entry angle and a tool exit angle for that segment, such that the variation of the function of engagement within each partition of the segment is within a predetermined range; and determining a feedrate of the tool based on the function of engagement for each segment in the set of segments, wherein the determining of the function of engagement includes the engagement angle and one or a combination of geometric properties of the engagement surface, and a parameter defining an abrasive resistance of a material of the workpiece to the machining;

machining the workpiece based on the determined feedrate of the tool for each segment of the path.

2. The method of claim 1, wherein the partitioning further comprises:

receiving a set of numerically controlled (NC) segments defined by the path of the tool;

determining, for each NC segment a variation of the function of engagement; and partitioning at least one NC segment such that the variation of the function of engagement within each partition of the NC segment is within a predetermined range.

3. The method of claim 2, further comprising:

grouping neighboring partitions of different NC segments if a segment formed as a result of the grouping has the variation of the parameter within the predetermined range.

4. The method of claim 2, wherein machining instructions or G-code controlling the machining include the set of NC segments.

5. The method of claim 2, wherein the function of engagement includes the engagement surface between the tool and the workpiece during the machining, and further comprising:

determining an initial engagement surface at the beginning of the NC segment and a final engagement surface at the end of the NC segment; and partitioning the NC segment if a difference between the initial and the final engagement surface is outside the predetermined range.

6. The method of claim 5, further comprising:

determining the engagement surface during a simulation of the machining the workpiece by a relative motion between the tool and the workpiece.

7. The method of claim 2, wherein the function of engagement includes the engagement surface between the tool and the workpiece during the machining, and further comprising:

arranging a set of points on at least a part of a surface of the tool;

determining a distance between each point in the set of points and a surface of the workpiece modified by the motion; and determining the engagement surface based on a subset of the points having the distance less than a threshold.

8. The method of claim 2, wherein the function of the engagement includes the engagement surface or an engagement angle between the tool and the workpiece, and wherein determining the variation of the function of engagement comprises:

determining the function of engagement at different points along the NC segment to determine the variation of the function of the engagement.

9. The method of claim 8, further comprising generating a swept volume for the NC segment of the path of the tool, the NC segment defines the motion of the tool from a previous position to a next position of the tool during a simulation;

populating the swept volume representing a motion of the tool in relation to the workpiece with a set of rays to determine a set of points of intersections of the rays with a surface of the workpiece modified by the swept volume;

determining the function of engagement at each point of intersection to produce a set of results of the function of engagement; and comparing the results of the function of engagement to determine the variation of the function of engagement.

10. The method of claim 9, further comprising:
determining the function of engagement between two neighboring points of intersection if a difference between results of the function of engagement at the neighboring points is above a threshold.

11. A simulation system for determining a feedrate of a tool during a simulation of a machining of the workpiece by a motion of the tool according to a path, wherein the workpiece is represented by a model of the workpiece including an object distance field defining a surface of the workpiece, the tool is represented by a model of the tool including a tool distance field defining a surface of the tool, and the motion is represented by at least one swept volume including a swept volume distance field defining a surface of the swept volume, the path is represented by a parametric function, comprising a processor for:
determining a function of engagement of the tool intersecting the workpiece at an instant of the simulation based on distance values between a set of points arranged on the surface of the tool and a surface of an in-process workpiece defined by the object distance field modified by the swept volume distance field at the instant of the simulation to produce a variation of the function of engagement, wherein the tool moves relative to the workpiece and makes contact with the workpiece over an engagement surface, consisting of an engagement area bounded by a tool entry angle and a tool exit angle, which together define an engagement angle, where the tool removes material;
partitioning the path into a set of segments according to the variation of the function of engagement, such that the partitioning of the path for each segment is based on the variation of the function of engagement of the tool and the workpiece having a swept volume for an area of the workpiece of that segment, and an angle of engagement of the tool contacting the area of the workpiece between a tool entry angle and a tool exit angle for that segment, such that, within each segment, the variation of the function of engagement is within a predetermined range; and
determining a feedrate of the tool based on the function of engagement for each segment in the set of segments, wherein the determining of the function of engagement includes the engagement angle and one or a combination of the engagement surface, and a parameter defining an abrasive resistance of a material of the workpiece to the machining;
machining the workpiece based on the determined feedrate of the tool for each segment of the path.

12. The simulation system of claim 11, wherein the variation of the function of engagement is determined during the simulation of the machining according to a numerically controlled (NC) segment, wherein the processor is configured for partitioning the NC segment such that the variation of the function of engagement within each partition of the NC segment is within the predetermined range.

13. A method for determining a feedrate of a tool of a milling system, wherein the tool machining a workpiece according to a path obtained by using a processor in connection with a memory and the milling system, such that the tool moves relative to the workpiece and makes contact with the workpiece over an engagement surface, consisting of an engagement area bounded by entry angle and exit angle which together define an engagement angle, where the tool removes material, the method comprising the steps of:
partitioning the path of the tool into a set of segments, such that within each segment a function of engagement of the tool and the workpiece is substantially constant, wherein the partitioning includes:
receiving a set of numerically controlled (NC) segments defined by the path of the tool;
determining, for each NC segment a variation of the function of engagement; and
partitioning at least one NC segment such that the variation of the function of engagement within each partition of the NC segment is within a predetermined range;
representing the workpiece by a composite adaptively sampled distance filed (CADF) that includes:
generating a swept volume for the NC segment of the path of the tool, the NC segment defines the motion of the tool from a previous position to a next position of the tool during a simulation;
casting rays through the swept volume to represent a motion of the tool in relation to the workpiece;
determining a volume removed from the workpiece by the swept volume based on intersections of at least some rays with the workpiece; and
determining the variation of the function of engagement based on variations in the removed volume; and
determining a feedrate of the tool based on the function of engagement for each segment in the set of segments, wherein determining the function of engagement includes the engagement angle and one or a combination of geometric properties of the engagement surface, and a parameter defining an abrasive resistance of a material of the workpiece to the machining;
machining the workpiece based on the determined feedrate of the tool for each segment of the path.

14. The method of claim 13, wherein the predetermined threshold is defined by a mechanical design of the milling system.

* * * * *